(12) United States Patent
See et al.

(10) Patent No.: US 8,718,582 B2
(45) Date of Patent: May 6, 2014

(54) MULTI-MODE POWER AMPLIFIERS

(75) Inventors: Puay H. See, San Diego, CA (US);
Richard M. Schierbeck, II, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 499 days.

(21) Appl. No.: 12/365,853

(22) Filed: Feb. 4, 2009

(65) Prior Publication Data
US 2009/0201084 A1 Aug. 13, 2009

Related U.S. Application Data

(60) Provisional application No. 61/027,351, filed on Feb. 8, 2008.

(51) Int. Cl.
*H04B 1/034* (2006.01)
*H03G 3/00* (2006.01)

(52) U.S. Cl.
USPC ........................ 455/127.3; 330/278

(58) Field of Classification Search
USPC ........................ 455/127.3; 330/278
See application file for complete search history.

(56) References Cited

U.S. PATENT DOCUMENTS

| | | | |
|---|---|---|---|
| 5,276,912 A * | 1/1994 | Siwiak et al. | 455/73 |
| 5,438,684 A * | 8/1995 | Schwent et al. | 455/552.1 |
| 5,530,923 A * | 6/1996 | Heinonen et al. | 455/126 |
| 5,548,246 A * | 8/1996 | Yamamoto et al. | 330/51 |
| 5,661,434 A * | 8/1997 | Brozovich et al. | 330/51 |
| 5,774,017 A | 6/1998 | Adar | |
| 5,834,975 A * | 11/1998 | Bartlett et al. | 330/278 |
| 6,111,459 A * | 8/2000 | Nishijima et al. | 330/51 |
| 6,400,227 B1 * | 6/2002 | Goldfarb et al. | 330/295 |
| 6,597,242 B2 * | 7/2003 | Petz et al. | 330/51 |
| 6,794,935 B2 * | 9/2004 | Klomsdorf et al. | 330/129 |
| 7,170,341 B2 * | 1/2007 | Conrad et al. | 330/51 |

(Continued)

FOREIGN PATENT DOCUMENTS

| | | | |
|---|---|---|---|
| JP | H03104408 A | 5/1991 | |
| JP | H10190378 A | 7/1998 | |

(Continued)

OTHER PUBLICATIONS

International Search Report—PCT/US2009/033466—International Search Authority—European Patent Office, Apr. 27, 2009.

(Continued)

*Primary Examiner* — Kenneth B. Wells
(74) *Attorney, Agent, or Firm* — Ramin Mobarhan

(57) ABSTRACT

Multi-mode power amplifiers that can support multiple radio technologies and/or multiple frequency bands are described. In one exemplary design, a first linear power amplifier supporting multiple radio technologies may be used to amplify a first RF input signal (e.g., for low band) and provide a first RF output signal. A second linear power amplifier also supporting the multiple radio technologies may be used to amplify a second RF input signal (e.g., for high band) and provide a second RF output signal. Each linear power amplifier may include multiple (e.g., three) chains coupled in parallel. Each chain may be selectable to amplify an RF input signal and provide an RF output signal for a respective range of output power levels. An RF input signal may be a phase modulated signal or a quadrature modulated signal and may be predistorted to account for non-linearity of the power amplifier.

44 Claims, 14 Drawing Sheets

(56) References Cited

U.S. PATENT DOCUMENTS

| | | | |
|---|---|---|---|
| 7,853,290 B2 * | 12/2010 | Itkin et al. | 455/552.1 |
| 8,160,520 B2 * | 4/2012 | Srinivasan et al. | 455/127.3 |
| 8,232,857 B1 * | 7/2012 | Wright et al. | 336/183 |
| 8,285,229 B2 * | 10/2012 | Silver et al. | 455/127.1 |
| 2002/0030541 A1 | 3/2002 | Tsutsui et al. | |
| 2003/0048132 A1 | 3/2003 | Kagaya et al. | |
| 2003/0107433 A1 | 6/2003 | Arai et al. | |
| 2006/0033568 A1 | 2/2006 | Blednov | |
| 2008/0003960 A1 | 1/2008 | Zolfaghari | |
| 2008/0024225 A1 | 1/2008 | Tsutsui et al. | |

FOREIGN PATENT DOCUMENTS

| | | |
|---|---|---|
| JP | 2000244264 A | 9/2000 |
| JP | 2000278109 A | 10/2000 |
| JP | 2001267865 A | 9/2001 |
| JP | 2002094331 A | 3/2002 |
| JP | 2002135060 A | 5/2002 |
| JP | 2002330030 A | 11/2002 |
| JP | 2003087060 A | 3/2003 |
| JP | 2003309436 A | 10/2003 |
| JP | 2005020476 A | 1/2005 |
| JP | 2005110327 A | 4/2005 |
| JP | 2006074595 A | 3/2006 |
| JP | 2006115441 A | 4/2006 |
| JP | 2006345490 A | 12/2006 |
| JP | 2007329642 A | 12/2007 |
| WO | WO2007025135 | 3/2007 |

OTHER PUBLICATIONS

Written Opinion—PCT/US2009/033466, International Search Authority, European Patent Office, Apr. 27, 2009.

Taiwan Search Report—TW098103912—TIPO—Jun. 26, 2012.

\* cited by examiner

MULTI-MODE POWER AMPLIFIERS

CLAIM OF PRIORITY UNDER 35 U.S.C. §119

The present Application for Patent claims priority to Provisional U.S. Application Ser. No. 61/027,351, entitled "MULTI-MODE POWER AMPLIFIERS," filed Feb. 8, 2008, assigned to the assignee hereof, and expressly incorporated herein by reference.

BACKGROUND

I. Field

The present disclosure relates generally to electronics, and more specifically to power amplifiers (PAs).

II. Background

Power amplifiers are widely used in various wireless communication systems to provide amplification and output drive for radio frequency (RF) signals prior to transmission over the air. For example, power amplifiers are used in Global System for Mobile Communications (GSM) systems, Wideband Code Division Multiple Access (WCDMA) systems, etc. Power amplifiers are also used in base stations as well as in terminals.

Power amplifiers are typically required to meet various system specifications for spectral mask, transmit time mask, harmonics distortion, output noise, output power level, etc. GSM and WCDMA systems also require a terminal to be able to adjust its output power over a wide range, e.g., 30 dB or more for GSM, and more than 70 dB for WCDMA. In order to meet the various system specifications at the maximum output power level, power amplifiers are often designed with large-size transistors and biased with high current and/or voltage. The high bias current and/or voltage result in low efficiency for the power amplifiers at lower output power levels for the more common operating scenarios.

Many terminals are portable and powered by internal batteries. For a portable terminal, a power amplifier may consume a significant amount of battery power, which may then shorten both standby time between battery recharges and talk time during operation. Efficient power amplifiers with lower power consumption are thus highly desirable.

SUMMARY

Efficient multi-mode power amplifiers that can support multiple radio technologies and/or multiple frequency bands are described herein. In an aspect, linear power amplifiers may be used to support multiple radio technologies. A linear power amplifier is a power amplifier that can meet spectral mask requirements for one or more radio technologies over all or a portion of the total output power range. In one exemplary design, a first linear power amplifier supporting multiple radio technologies may be used to amplify a first RF input signal and provide a first RF output signal. A second linear power amplifier also supporting the multiple radio technologies may be used to amplify a second RF input signal and provide a second RF output signal. The first linear power amplifier may support a low frequency band (e.g., less than one gigahertz (GHz)), and the second linear power amplifier may support a high frequency band (e.g., greater than one GHz), or vice versa. Each linear power amplifier may include multiple (e.g., three) chains coupled in parallel. Each chain may be selectable to amplify an RF input signal and provide an RF output signal for a respective range of output power levels. The multiple chains may be biased with different amounts of current and/or implemented with transistors of different sizes. All of the chains may be selectable for at least one radio technology (e.g., GSM), and a subset of the chains may be selectable for at least one other radio technology (e.g., WCDMA). The multiple radio technologies may include a radio technology (e.g., GSM) having a constant envelope modulated signal and another radio technology (e.g., WCDMA) having a variable envelope modulated signal. The linear power amplifiers may be used in conjunction with polar modulation and/or quadrature modulation. An RF input signal may thus comprise a phase modulated signal from polar modulation or a quadrature modulated signal from quadrature modulation.

In another aspect, a linear power amplifier may be used to amplify an RF input signal having a constant envelope (e.g., for GSM) and provide an RF output signal. The linear power amplifier may include multiple chains coupled in parallel. One chain may be selected to amplify the RF input signal with a fixed gain. The RF input signal may have a variable signal level, and the signal level of the RF output signal may track the variable signal level of the RF input signal.

In yet another aspect, a power amplifier may be used to amplify an RF input signal and provide an RF output signal, with the RF input signal being pre-distorted to compensate for non-linearity of the power amplifier. Pre-distortion may be applied to an envelope signal generated by polar modulation. The RF input signal may then be generated based on the pre-distorted envelope signal.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
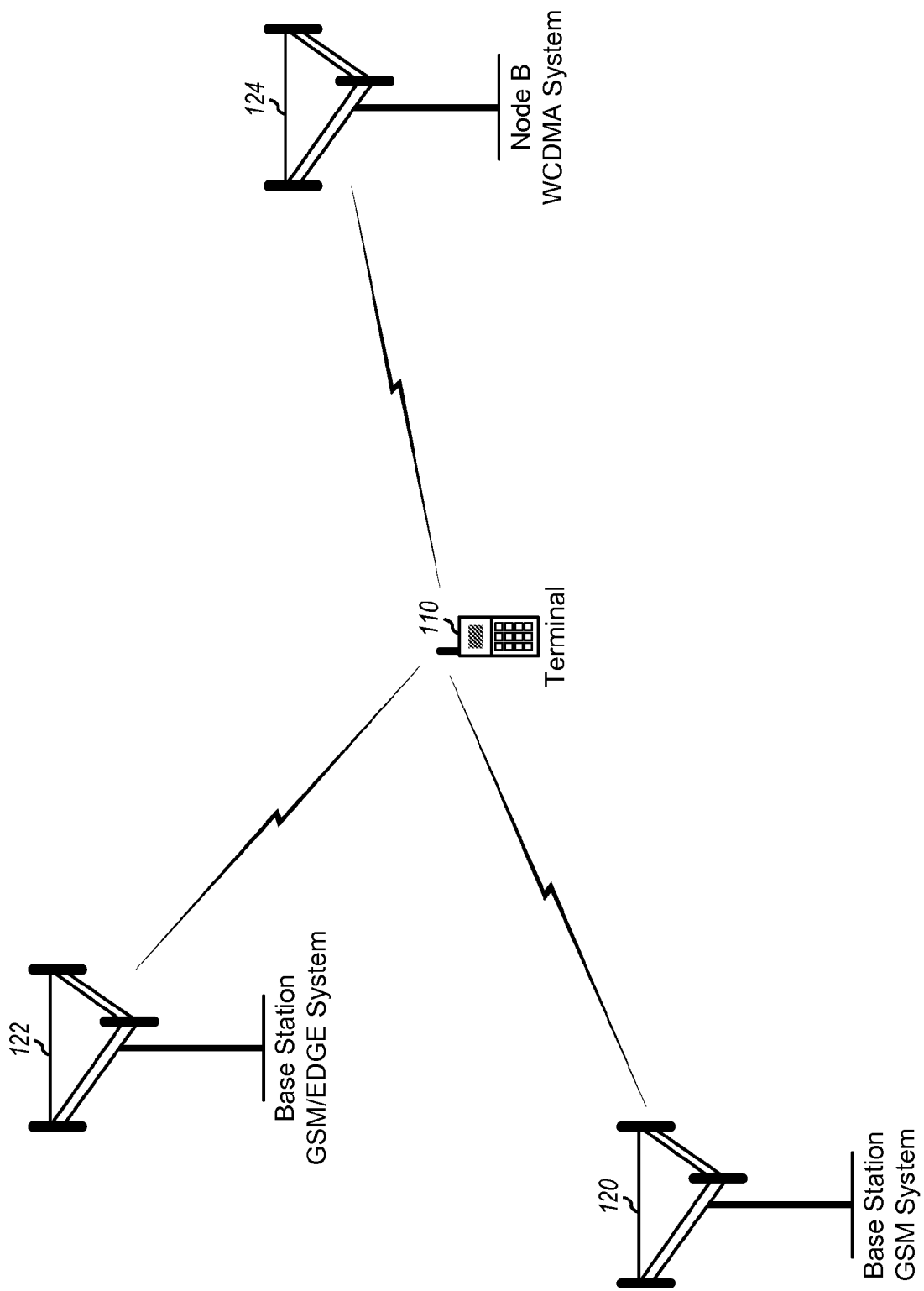
FIG. 1 shows a terminal capable of communicating with multiple wireless systems.

FIG. 1 shows a terminal 110 capable of communicating with multiple wireless communication systems of different radio technologies. Terminal 110 may also be referred to as a mobile station, a user equipment, an access terminal, a subscriber unit, a station, etc. Terminal 110 may be a cellular phone, a personal digital assistant (PDA), a wireless communication device, a wireless modem, a handheld device, a laptop computer, a cordless phone, a wireless local loop (WLL) station, etc.

In general, terminal 110 may be capable of communicating with a CDMA system, a Time Division Multiple Access (TDMA) system, a Frequency Division Multiple Access (FDMA) system, an Orthogonal FDMA (OFDMA) system, a Single-Carrier FDMA (SC-FDMA) system, etc. The terms "system" and "network" are often used interchangeably. A CDMA system utilizes code division multiplexing (CDM), an OFDMA system utilizes orthogonal frequency division multiplexing (OFDM), and an SC-FDMA system utilizes single-carrier frequency division multiplexing (SC-FDM). A CDMA system may implement a radio technology such as WCDMA, cdma2000, etc. cdma2000 covers IS-95, IS-2000 and IS-856 standards. IS-95 and IS-2000 are commonly referred to as CDMA2000 1X (or simply, 1X), and IS-856 is commonly referred to as CDMA2000 1xEV-DO (or simply, 1xEV-DO). A TDMA system may implement a radio technology such as GSM, Enhanced Data for GSM Evolution (EDGE), etc. An OFDMA system may implement a radio technology such as Ultra Mobile Broadband (UMB), Evolved Universal Terrestrial Radio Access (E-UTRA), etc. GSM, WCDMA and E-UTRA are described in documents from an organization named "3rd Generation Partnership Project" (3GPP). cdma2000 and UMB are described in documents from an organization named "3rd Generation Partnership Project 2" (3GPP2). 3GPP and 3GPP2 documents are publicly available.

In the example shown in FIG. 1, terminal 110 may communicate with a base station 120 in a GSM system, a base station 122 in a GSM/EDGE system, or a Node B 124 in a WCDMA system. A WCDMA system is also commonly referred to as a Universal Mobile Telecommunication System (UMTS) network. Terminal 110 may also be capable of communicating with fewer or more wireless systems. For clarity, much of the following description assumes that terminal 110 supports GSM, EDGE and WCDMA. The terms "WCDMA" and "UMTS" are often used interchangeably.

GSM uses Gaussian minimum shift keying (GMSK), which is a modulation scheme that generates a modulated signal having a constant envelope. EDGE uses 8-ary phase shift keying (8-PSK), which is a modulation scheme employing a signal constellation having 8 evenly spaced points on a unit circle. WCDMA and cdma2000 use quadrature phase shift keying (QPSK) and quadrature amplitude modulation (QAM).

The standard for each radio technology typically specifies an emission mask that indicates the amount of output power allowed at different frequencies. The emission requirements may differ for different radio technologies.

Figure 2:
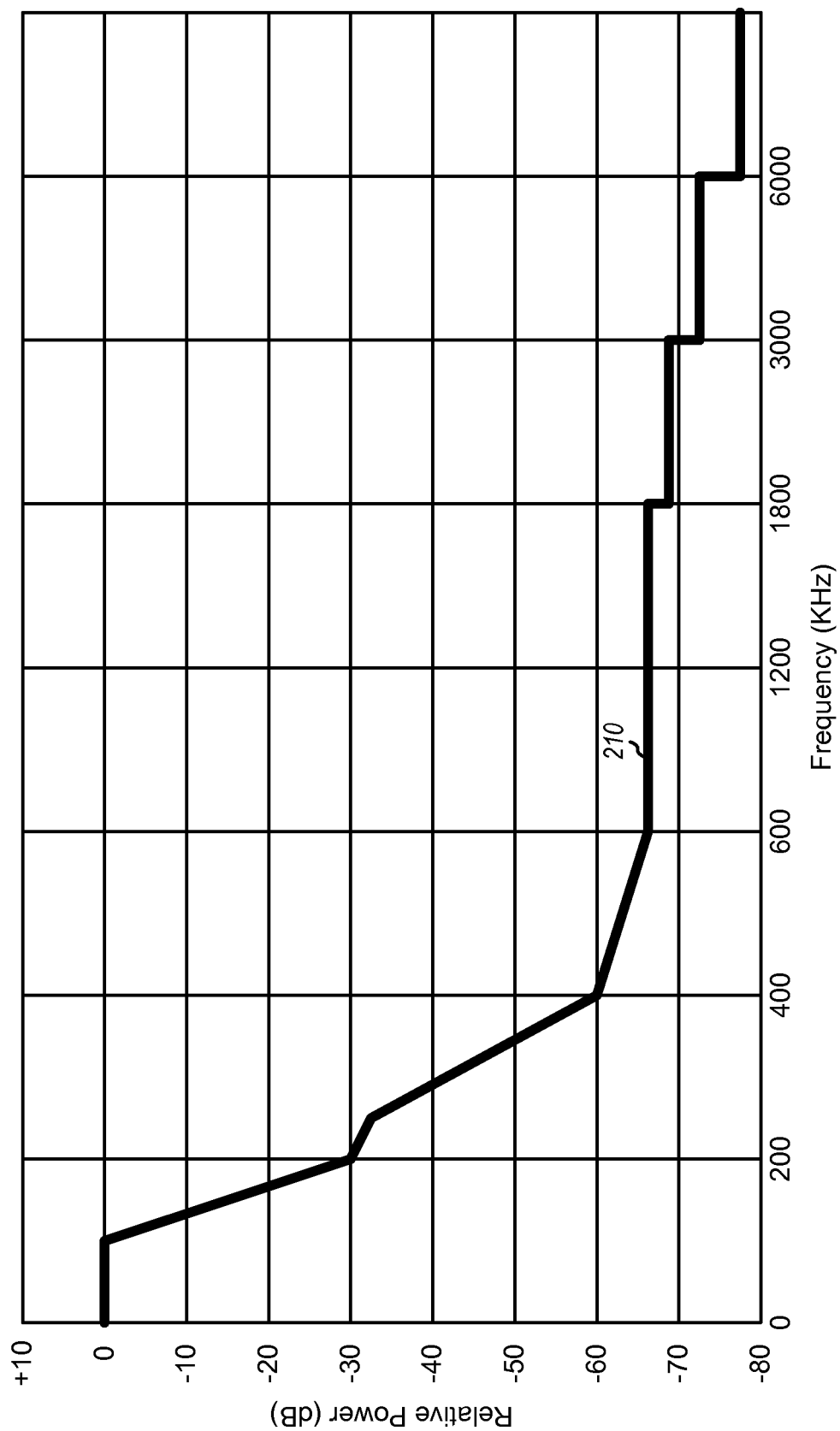
FIG. 2 shows an emission mask for GSM.

FIG. 2 shows an emission mask for GSM for a low frequency band. A GSM signal transmitted by terminal 110 has a one-sided signal bandwidth of 100 kilohertz (KHz). The GSM signal is required to have output power lower than the levels given by plot 210 at 200 KHz and beyond. The emission requirements for GSM and GSM/EDGE are described in 3GPP TS 05.03, entitled "Radio transmission and reception," Release 1999, which is publicly available.

The emission requirements for WCDMA are given in 3GPP TS 25.101, entitled "User Equipment (UE) radio transmission and reception (FDD)." The emission requirements for cdma2000 are given in 3GPP2 C.S0011-B, entitled "Recommended Minimum Performance Standards for cdma2000 Spread Spectrum Mobile Stations." These documents are publicly available.

For terminal 110, the amount of out-of-band emission at different frequencies may be dependent on various factors such as the linearity of the power amplifier used to generate the RF output signal, the modulation scheme used for the modulated signal, etc. In general, a more linear power amplifier may generate less out-of-band emission whereas a less linear power amplifier may generate more out-of-band emission. Furthermore, a constant amplitude modulation scheme such as GMSK may generate less out-of-band emission than modulation schemes such as 8-PSK, QPSK and QAM.

Terminal 110 may support communication with different wireless systems, as shown in FIG. 1. Terminal 110 may also support communication on one or more frequency bands for each wireless system. For example, terminal 110 may support any of the frequency bands given in Table 1. In general, numerous frequency bands may be used for wireless communication. Terminal 110 may thus support frequency bands other than the ones listed in Table 1.

TABLE 1

| Band | Frequency Band | Common Name | Uplink Frequency |
|---|---|---|---|
| High Band | UMTS 2100 | IMT-2000 | 1920-1980 MHz |
|  | UMTS 1900 | PCS | 1850-1910 MHz |
|  | UMTS 1800 | DCS | 1710-1785 MHz |
| Low Band | UMTS 900 |  | 880-915 MHz |
|  | UMTS 850 | Cellular | 824-849 MHz |

Terminal 110 may support quadrature modulation, polar modulation, and/or other types of modulation. For quadrature modulation, inphase (I) and quadrature (Q) local oscillator (LO) signals may be modulated with I and Q modulating signals and combined to obtain a quadrature modulated signal, as follows:

$$S(t) = M_I(t) \cdot \cos(\omega t) + M_Q(t) \cdot \sin(\omega t) \qquad \text{Eq(1)}$$

where $M_I(t)$ is the I modulating signal and $M_Q(t)$ is the Q modulating signal, $\cos(\omega t)$ is the I LO signal and $\sin(\omega t)$ is the Q LO signal, $S(t)$ is the quadrature modulated signal, and $\omega$ is the frequency of the LO signals (in radians/second) and t is time.

The I and Q LO signals are 90° out of phase. The modulated components $M_I(t) \cdot \cos(\omega t)$ and $M_Q(t) \cdot \sin(\omega t)$ are in quadrature and, when combined, result in the modulated signal $S(t)$ being both amplitude and phase modulated.

For polar modulation, the modulated signal $S(t)$ may be expressed in a form to explicitly show the amplitude and phase modulation, as follows:

$$S(T) = E(t) \cdot \cos(\omega t + \phi(t)), \qquad \text{Eq (2)}$$

where $$E(t) = \sqrt{M_I^2(t) + M_Q^2(t)}, \text{ and} \qquad \text{Eq (3)}$$

$$\phi(t) = \arctan\left(\frac{M_Q(t)}{M_I(t)}\right). \qquad \text{Eq (4)}$$

As shown in equations (2) through (4), for polar modulation, the I and Q modulating signals, $M_I(t)$ and $M_Q(t)$, may be converted to an envelope signal, $E(t)$, and a phase signal, $\phi(t)$. The phase signal may be used to modulate the phase of an LO signal, $\cos(\omega t)$, to obtain a phase modulated signal, $\cos(\omega t + \phi(t))$. The envelope signal may be used to modulate the amplitude of the phase modulated signal to obtain the polar modulated signal S(t) shown in equation (2).

In the description herein, a modulated signal is a signal that is both amplitude and phase modulated. A phase modulated signal is a signal that is phase modulated but not amplitude modulated. A quadrature modulated signal is a modulated signal obtained with quadrature modulation, e.g., as shown in equation (1). A polar modulated signal is a modulated signal obtained with polar modulation, e.g., as shown in equation (2). A polar modulated signal comprises a phase modulated signal and an envelope signal.

In one exemplary design, polar modulation may be used for GSM and EDGE, and quadrature modulation may be used for WCDMA. Polar modulation may provide better signal-to-noise ratio (SNR) and better linearity than quadrature modulation.

However, the phase modulated signal from polar modulation may be much wider than the I and Q modulating signals. Thus, it may be more difficult to implement polar modulation for WCDMA. In general, polar modulation may be used for GSM, EDGE, WCDMA, cdma2000, and/or other radio technologies.

Figure 3:
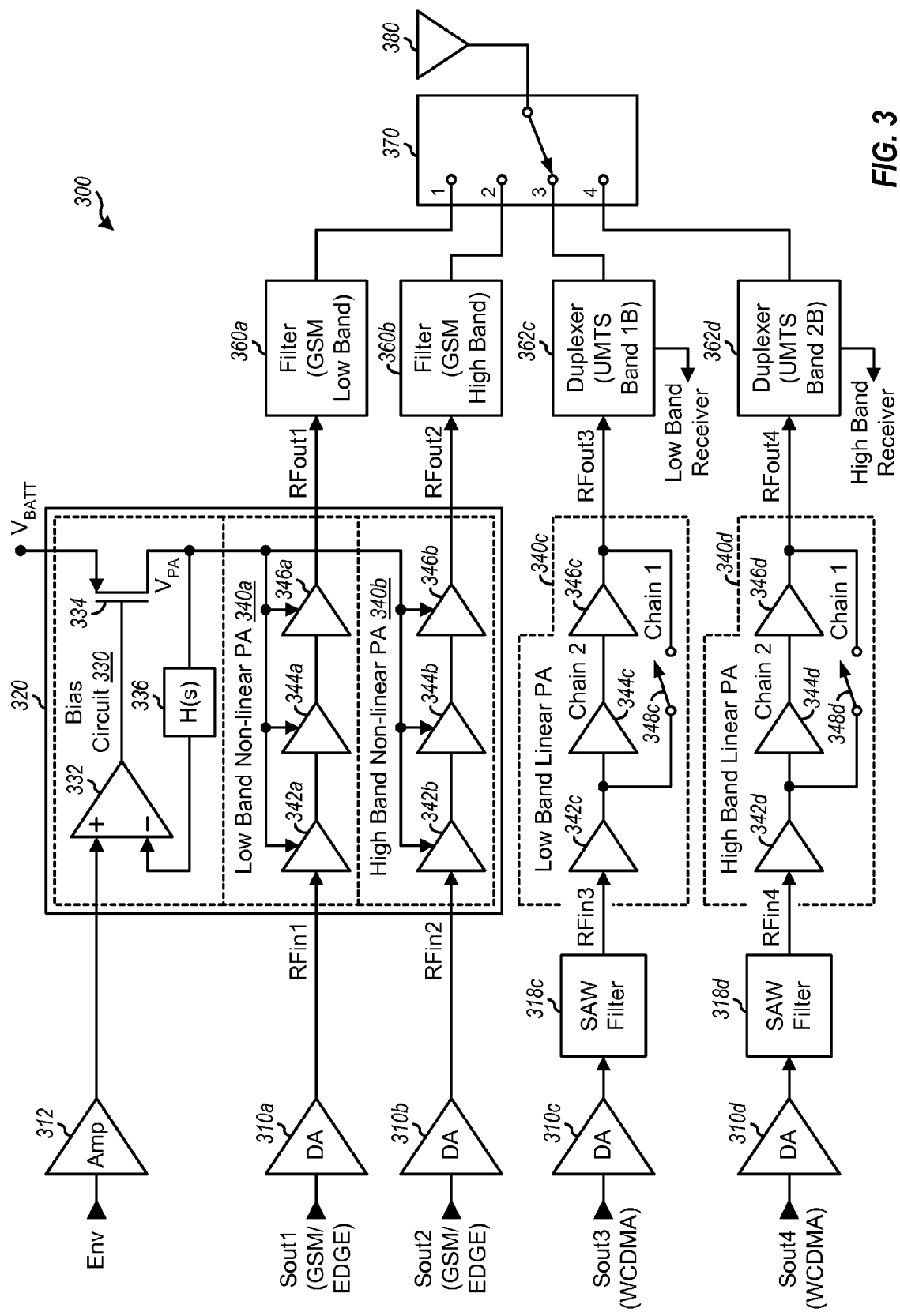
FIG. 3 shows a block diagram of a transmitter with linear and non-linear PAs.

FIG. 3 shows a block diagram of an exemplary design of a transmitter 300 for terminal 110. Transmitter 300 supports four frequency bands for GSM/EDGE and two frequency bands for WCDMA. Within transmitter 300, four driver amplifiers (DAs) 310a through 310d receive and amplify four signals Sout1 through Sout4, respectively.

The Sout1 signal may be a phase modulated signal for GSM or EDGE for low band, the Sout2 signal may be a phase modulated signal for GSM or EDGE for high band, the Sout3 signal may be a modulated signal for WCDMA for low band, and the Sout4 signal may be a modulated signal for WCDMA for high band. An amplifier (Amp) 312 may receive and amplify an envelope signal, Env, for GSM or EDGE.

A GSM/EDGE power amplifier module 320 receives the output signals from driver amplifiers 310a and 310b and amplifier 312. Module 320 includes a bias circuit 330, a low band non-linear power amplifier 340a, and a high band non-linear power amplifier 340b. Within bias circuit 330, an amplifier 332 receives the amplified envelope signal at its non-inverting input and the output of a feedback circuit 336 at its inverting input and has its output coupled to the gate of a P-channel metal oxide semiconductor field effect transistor (MOSFET) 334. MOSFET 334 has its source coupled to a battery supply voltage $V_{BATT}$ and its drain providing a supply voltage $V_{PA}$ for power amplifiers 340a and 340b. Feedback circuit 336 receives the $V_{PA}$ supply voltage and provides a fixed gain and lowpass filtering (e.g., of several MHz) for the $V_{PA}$ supply voltage.

Power amplifier 340a receives and amplifies a first RF input signal, RFin1, from driver amplifier 310a and provides a first RF output signal, RFout1. Power amplifier 340a includes three amplifier stages 342a, 344a and 346a that receive the RFin1 signal and generate the RFout1 signal having a variable signal level determined based on the $V_{PA}$ supply voltage. Similarly, power amplifier 340b receives and amplifies a second RF input signal, RFin2, from driver amplifier 310b and provides a second RF output signal, RFout2. Power amplifier 340b includes three amplifier stages 342b, 344b and 346b that generate the RFout2 signal having a variable signal level determined based on the $V_{PA}$ supply voltage. Bias circuit 320 and power amplifiers 340a and 340b support large signal polar modulation, which comprises amplitude modulation of a phase modulated signal by varying the gain of a power amplifier with an envelope signal.

For WCDMA, surface acoustic wave (SAW) filters 318c and 318d receive and filter the output signals from driver amplifiers 310c and 310d, respectively. A low band linear power amplifier 340c receives and amplifies a third RF input signal, RFin3, from SAW filter 318c and provides a third RF output signal, RFout3. Power amplifier 340c includes two parallel chains 1 and 2. Chain 1 includes an amplifier stage 342c and a switch 348c coupled in series. Chain 2 includes amplifier stages 342c, 344c and 346c coupled in series. One of the two chains may be selected to amplify the RFin3 signal and provide the RFout3 signal. Chain 1 may be selected when low output power is required. In this case, switch 348c may be closed, and amplifier stages 344c and 346c may be disabled. Chain 2 may be selected when high output power is required. In this case, amplifier stages 344c and 346c may be enabled, and switch 348c may be opened.

Similarly, a high band linear power amplifier 340d receives and amplifies a fourth RF input signal, RFin4, from SAW filter 318d and provides a fourth RF output signal, RFout4. Power amplifier 340d includes two parallel chains 1 and 2 comprising amplifier stages 342d, 344d and 346d and a switch 348d. Chain 1 may be selected when low output power is required, and chain 2 may be selected when high output power is required. The selected chain amplifies the RFin4 signal and provides the RFout4 signal.

Since GSM uses GMSK, the phase modulated signals from driver amplifiers 310a and 310b have constant envelope, i.e., constant signal amplitude. Because of the constant envelope, non-linear power amplifiers 340a and 340b may be used to amplify the phase modulated signals for GSM. The non-linear power amplifiers may have better efficiency than linear power amplifiers and may be class C power amplifiers operating in saturation region. The phase modulated signals may be fixed at a particular power level (e.g., 3 dBm). The output power levels of the RFout1 and RFout2 signals may then be varied (e.g., from 0 dBm to 35 dBm) by adjusting the $V_{PA}$ supply voltage. The gains of power amplifiers 340a and 340b may thus be varied by changing the $V_{PA}$ supply voltage.

WCDMA generates modulated signals having amplitude that varies over time. Because of the variable envelope, linear power amplifiers 340c and 340d may be used to amplify the modulated signals for WCDMA. The linear power amplifiers may be class AB power amplifiers operating in the linear region. The linear operation allows the power amplifiers to track amplitude variation in the modulated signals without clipping or distorting these signals, either of which may cause undesired artifacts in the frequency spectrum of the RF output signals. Linear power amplifiers 340c and 340d may be operated with a fixed gain, and the output power levels of the RFout3 and RFout4 signals may be varied (e.g., from −50 dBm to +28 dBm) by adjusting the RF input power level.

EDGE also generates modulated signals having amplitude that varies over time. However, non-linear power amplifiers 340a and 340b may be used to amplify the phase modulated signals for EDGE, and the envelope signal and the phase modulated signals may be pre-distorted to compensate for non-linearity of power amplifiers 340a and 340b, as described below.

In one exemplary design, a power amplifier may be categorized as follows:
  Linear power amplifier—meet WCDMA spectral mask requirements but does not meet EDGE spectral mask requirements, or
  Non-linear power amplifier—does not meet spectral mask requirements for any radio technology except for GSM with constant envelope signal.

The GSM spectral mask requirements may be the least difficult to meet due to the constant envelope signal and may be met with linear or non-linear power amplifiers. The WCDMA spectral mask requirements may be more difficult to meet than the GSM spectral mask requirements and may be met with linear power amplifiers. The EDGE spectral mask requirements may be the most difficult to meet among the three radio technologies and may be met with a combination of linear power amplifiers and pre-distortion. An ideal power amplifier may be able to meet spectral mask requirements of all radio technologies without pre-distortion but may be difficult to design and/or may consume too much power.

GSM and EDGE use time division duplexing (TDD), and WCDMA uses frequency division duplexing (FDD). For TDD, terminal 110 can transmit and receive on the same frequency channel in different time slots. A switch may be used to couple either a transmitter or a receiver to an antenna at any given moment. For FDD, terminal 110 can transmit and receive on different frequency channels simultaneously. A duplexer may be used to route an RF output signal from a transmitter to an antenna and to route a received RF signal from the antenna to a receiver.

Filters 360a and 360b receive and filter the RFout1 and RFout2 signals from power amplifiers 340a and 340b and provide filtered signals to first and second ports, respectively, of a switch 370. Duplexers 362c and 362d couple the RFout3 and RFout4 signals from power amplifiers 340c and 340d to third and fourth ports, respectively, of switch 370. Duplexers 362c and 362d also couple the received RF signals from the third and fourth ports of switch 370 to low band and high band receivers (not shown in FIG. 3). Switch 370 couples an antenna 380 to one of the four ports depending on whether GSM/EDGE low band, GSM/EDGE high band, WCDMA low band, or WCDMA high band is selected. Switch 370 may also couple antenna 380 to low band and high band receivers for GSM/EDGE (not shown in FIG. 3).

Figure 4A:
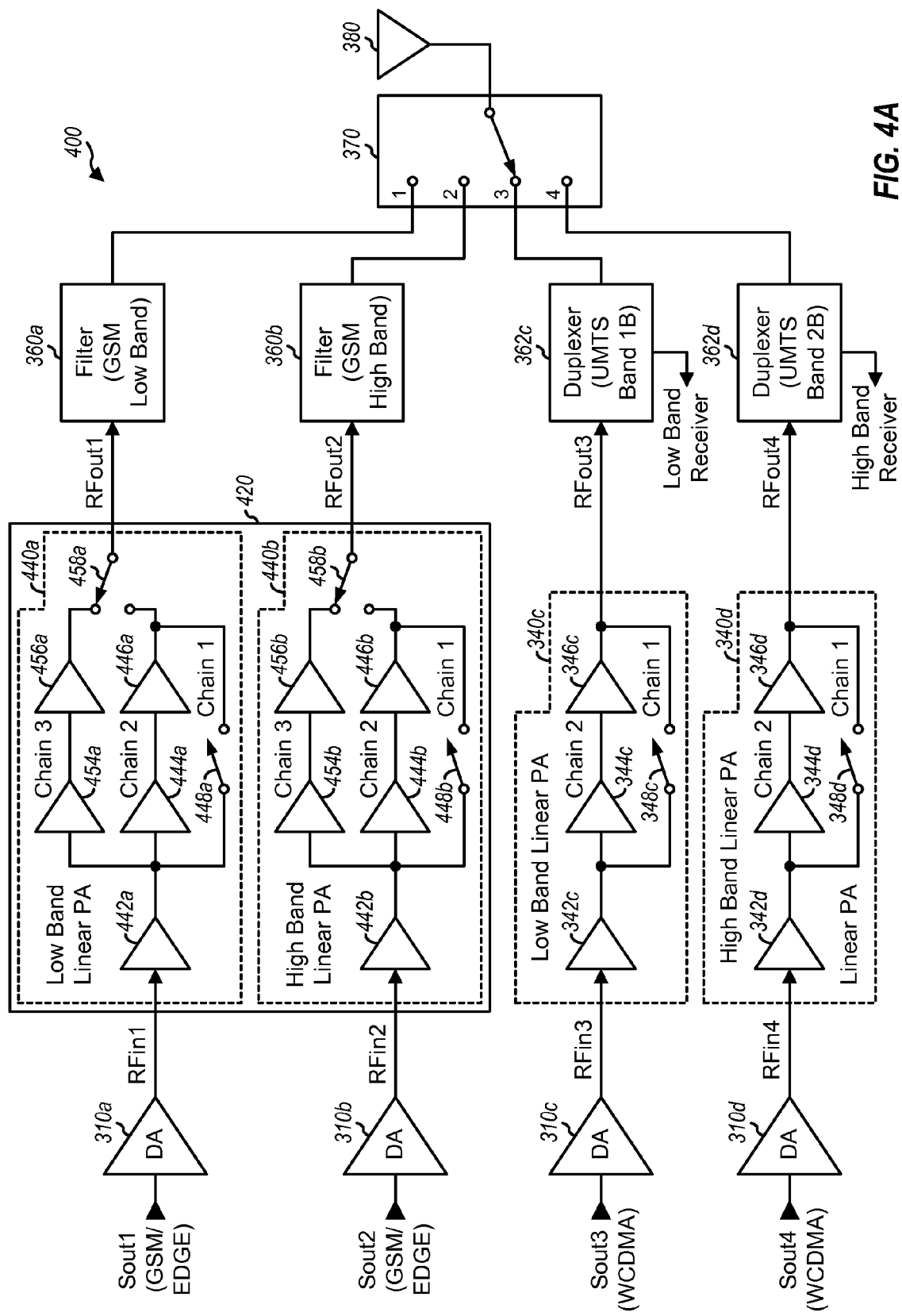
FIGS. 4A and 4B show block diagrams of two transmitters with linear PAs.

FIG. 4A shows a block diagram of an exemplary design of a transmitter 400 for terminal 110. Transmitter 400 supports four frequency bands for GSM/EDGE and two frequency bands for WCDMA. Transmitter 400 includes four driver amplifiers 310a through 310d, power amplifiers 340c and 340d, filters 360a and 360b, duplexers 362c and 362d, and switch 370, which are coupled as described above for FIG. 3. In the exemplary design shown in FIG. 4A, SAW filters 318c and 318d are omitted, and the output signals from driver amplifiers 310c and 310d are coupled directly to power amplifiers 340c and 340d, respectively. SAW filters 318c and 318d are used to remove noise in the receive frequency bands. This noise would be amplified by power amplifiers 340c and 340d and routed via duplexers 362c and 362d to the receivers. SAW filters 318c and 318d may be omitted if the noise in the receive frequency bands is sufficiently low.

Transmitter 400 further includes a GSM/EDGE power amplifier module 420, which replaces module 320 in FIG. 3. Module 420 includes a low band linear power amplifier 440a and a high band linear power amplifier 440b that receive and amplify the RFin1 and RFin2 signals from driver amplifiers 310a and 310b, respectively, and provide the RFout1 and RFout2 signals, respectively. Power amplifier 440a includes three parallel chains 1, 2 and 3. Chain 1 includes an amplifier stage 442a and a switch 448a coupled in series. Chain 2 includes amplifier stages 442a, 444a and 446a coupled in series. Chain 3 includes amplifier stages 442a, 454a and 456a coupled in series. A switch 458a couples the output of either amplifier stage 446a or 456a to the output of power amplifier 440a. Power amplifier 440b similarly includes three parallel chains 1, 2 and 3 comprising amplifier stages 442b, 444b, 446b, 454b and 456b and switches 448b and 458b. Switches 458a and 458b may be implemented within module 420, as shown in FIG. 4A, or external to module 420.

The three chains in each of power amplifiers 440a and 440b may be operated as follows:
 Chain 1—used for low output power,
 Chain 2—used for medium output power, and
 Chain 3—used for high output power.

Chain 1 may be operated with low bias current and/or implemented with smaller size transistors. Chain 2 may be operated with moderate bias current and/or implemented with medium size transistors. Chain 3 may be operated with high bias current and/or implemented with larger size transistors. In one exemplary design, first amplifier stage 442 has a fixed bias current for all three chains. In another exemplary design, first amplifier stage 442 has a variable bias current that is adjusted based on whether chain 1, 2 or 3 is selected. In general, each amplifier stage may have a fixed bias current or a variable bias current that may be adjusted based on the output power level and/or other factors. Chains 1, 2 and 3 may be selected for different output power ranges and may thus be used for coarse output power adjustment. Fine output power adjustment may be achieved by adjusting the RF input power level.

The use of linear power amplifiers 440a and 440b with multiple parallel chains for GSM/EDGE may provide certain advantages. For GSM, the constant envelope modulated signal allows power amplifiers 440a and 440b to meet GSM spectral mask requirements. For EDGE, pre-distortion may be used for chain 3 at high output power in order to meet EDGE spectral mask requirements. Chains 1 and 2 may be sufficiently linear and may be able to meet EDGE spectral mask requirements without the use of pre-distortion.

Linear power amplifiers 440a and 440b may be able to achieve similar or higher efficiency than non-linear power amplifiers 340a and 340b in FIG. 3. Each chain may be able to achieve similar or higher efficiency for its range of output power levels than non-linear power amplifier 340. Chain 3 may operate with high output power and may be able to achieve similar or higher efficiency than non-linear power amplifier 340. The adjustment of output power level by changing the input power level may further improve efficiency over non-linear power amplifier 340 with polar modulation.

Figure 4B:
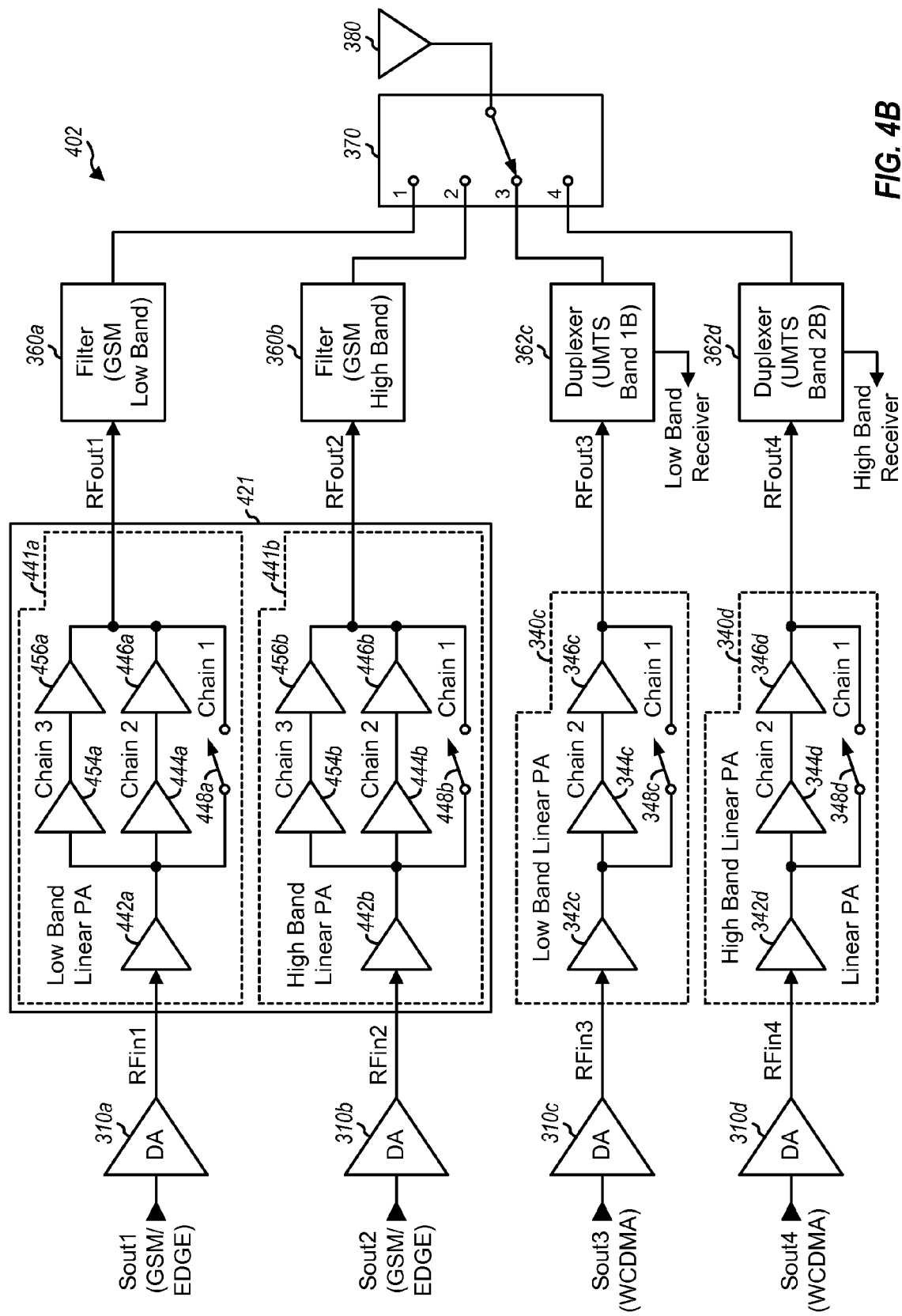

FIG. 4B shows a block diagram of an exemplary design of a transmitter 402 for terminal 110. Transmitter 402 includes all of the circuit blocks in transmitter 400 in FIG. 4A and further includes a GSM/EDGE power amplifier module 421 that replaces module 420 in FIG. 4A. Module 421 includes power amplifiers 441a and 441b that include all circuit blocks in power amplifiers 440a and 440b, respectively, except for switches 458a and 458b. In module 421, the outputs of amplifier stages 446a and 456a are coupled together and are further coupled to the output of power amplifier 441a. The outputs of amplifier stages 446b and 456b are coupled together and are further coupled to the output of power amplifier 441b.

In FIGS. 4A and 4B, amplifier stages 444 and 446 may be disabled when chain 2 is not selected, and amplifier stages 454 and 456 may be disabled when chain 3 is not selected. Alternatively, chains 2 and 3 may both be enabled, and the outputs of amplifier stages 446 and 456 may be combined to obtain higher output power in high power operation. Switches 458 in FIG. 4A typically have some insertion loss. This insertion loss may be avoided by coupling together the outputs of amplifier stages 446 and 456 in each power amplifier 441, as shown in FIG. 4B. Pre-distortion may be performed (e.g., for EDGE at high output power) as necessary in order to meet spectral mask requirements.

Figure 5A:
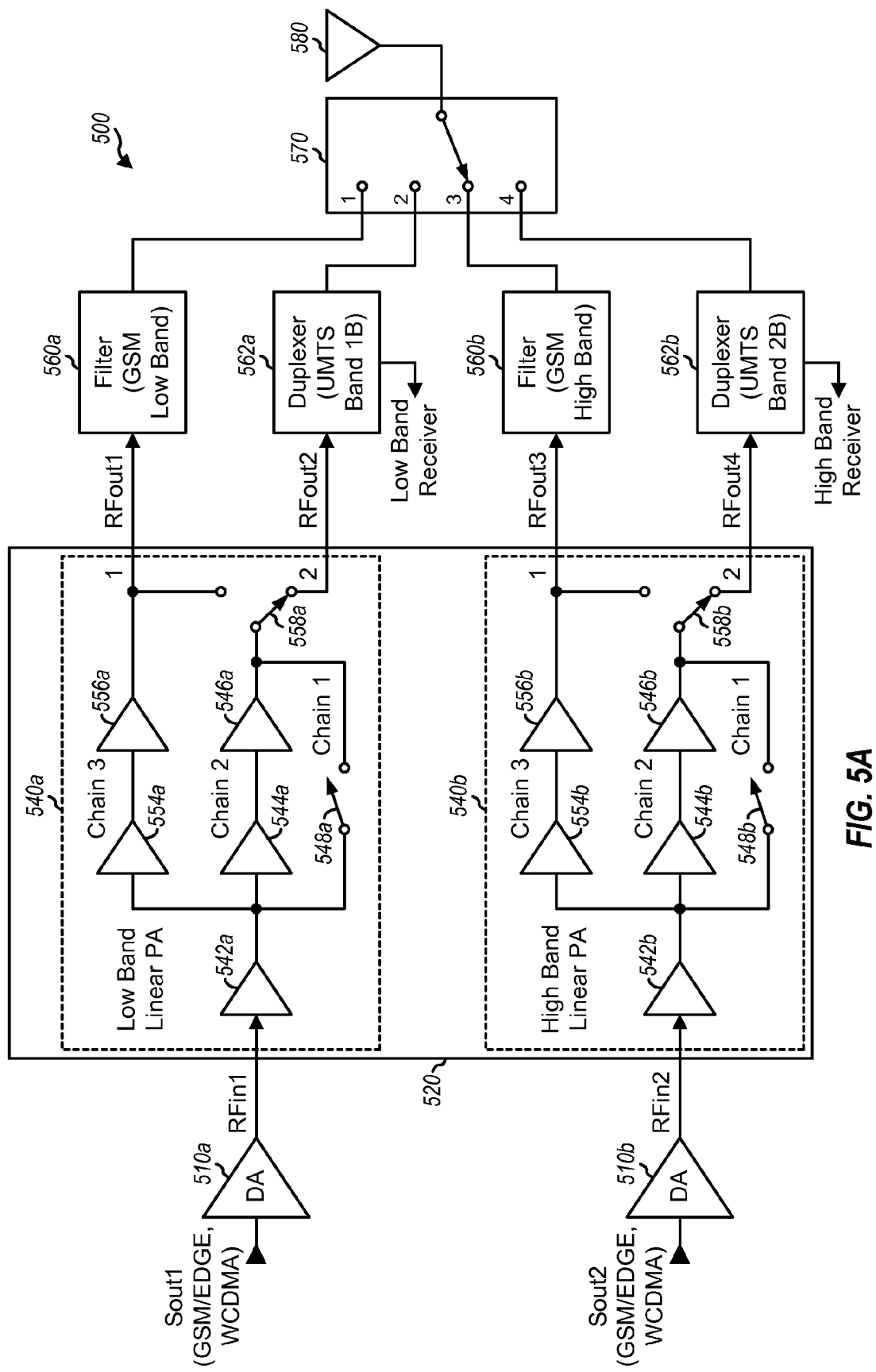
FIGS. 5A, 5B, 6 and 7 show block diagrams of four transmitters with shared linear PAs for multiple radio technologies.

FIG. 5A shows a block diagram of an exemplary design of a transmitter 500 for terminal 110. Transmitter 500 supports four frequency bands for GSM/EDGE and two frequency bands for WCDMA. Transmitter 500 includes driver amplifiers 510a and 510b, a power amplifier module 520, filters 560a and 560b, duplexers 562a and 562b, and a switch 570. Driver amplifier 510a receives and amplifies a Sout1 signal and provides an RFin1 signal. The Sout1 signal may be (i) a phase modulated signal for GSM or EDGE for low band, (ii) a modulated signal for WCDMA for low band, or (iii) some other signal for low band. Driver amplifier 510b receives and amplifies a Sout2 signal and provides an RFin2 signal. The Sout2 signal may be (i) a phase modulated signal for GSM or EDGE for high band, (ii) a modulated signal for WCDMA for high band, or (iii) some other signal for high band.

Power amplifier module 520 includes a low band linear power amplifier 540a and a high band linear power amplifier 540b that receive and amplify the RFin1 and RFin2 signals and provide RFout1 and RFout2 signals, respectively. Power amplifier 540a includes three parallel chains 1, 2 and 3 comprising amplifier stages 542a, 544a, 546a, 554a and 556a and a switch 548a, which are coupled as described above for FIG. 4A. An output switch 558a has its common port coupled to the output of amplifier stage 546a and its first and second throws coupled to first and second outputs, respectively, of power amplifier 540a. The output of amplifier stage 556a is coupled to the first output of power amplifier 540a. Power amplifier 540b includes three parallel chains 1, 2 and 3 comprising amplifier stages 542b, 544b, 546b, 554b and 556b and a switch 548b and further includes an output switch 558b, which are coupled in the same manner as power amplifier 540a. Switches 558a and 558b may be implemented within module 520, as shown in FIG. 5A, or external to module 520.

Filters 560a and 560b have their inputs coupled to the first output of power amplifiers 540a and 540b, respectively, and their outputs coupled to the first and third ports of switch 570. Duplexers 562a and 562b have their transmitter ports coupled to the second output of power amplifiers 540a and 540b, respectively, and their common ports coupled to the second and fourth ports of switch 570. Switch 570 has its common port coupled to an antenna 580. Switch 570 may also include more ports, which may be coupled to GSM/EDGE receivers for low band and high band (not shown in FIG. 5A).

For low band GSM/EDGE, switch 558a couples amplifier stage 546a to the first output of power amplifier 540a, and switch 570 couples its first port to antenna 580. For low band WCDMA, switch 558a couples amplifier stage 546a to the second output of power amplifier 540a, and switch 570 couples its second port to antenna 580. For high band GSM/EDGE, switch 558b couples amplifier stage 546b to the first output of power amplifier 540b, and switch 570 couples its third port to antenna 580. For high band WCDMA switch 558b couples amplifier stage 546b to the second output of power amplifier 540b, and switch 570 couples its fourth port to antenna 580.

In the exemplary design shown in FIG. 5A, only two linear power amplifiers 540a and 540b are used to support GSM, EDGE and WCDMA. For GSM/EDGE, chain 1 may be used for low output power, chain 2 may be used for medium output power, and chain 3 may be used for high output power. Chains 2 and 3 may also be combined to provide higher output power in high power operation. For WCDMA, chain 1 may be used for low to medium output power, and chain 2 may be used for medium to high output power. For GSM, EDGE and WCDMA, pre-distortion may be used to account for non-linearity of power amplifiers 540a and 540b in order to meet spectral mask requirements.

Figure 5B:
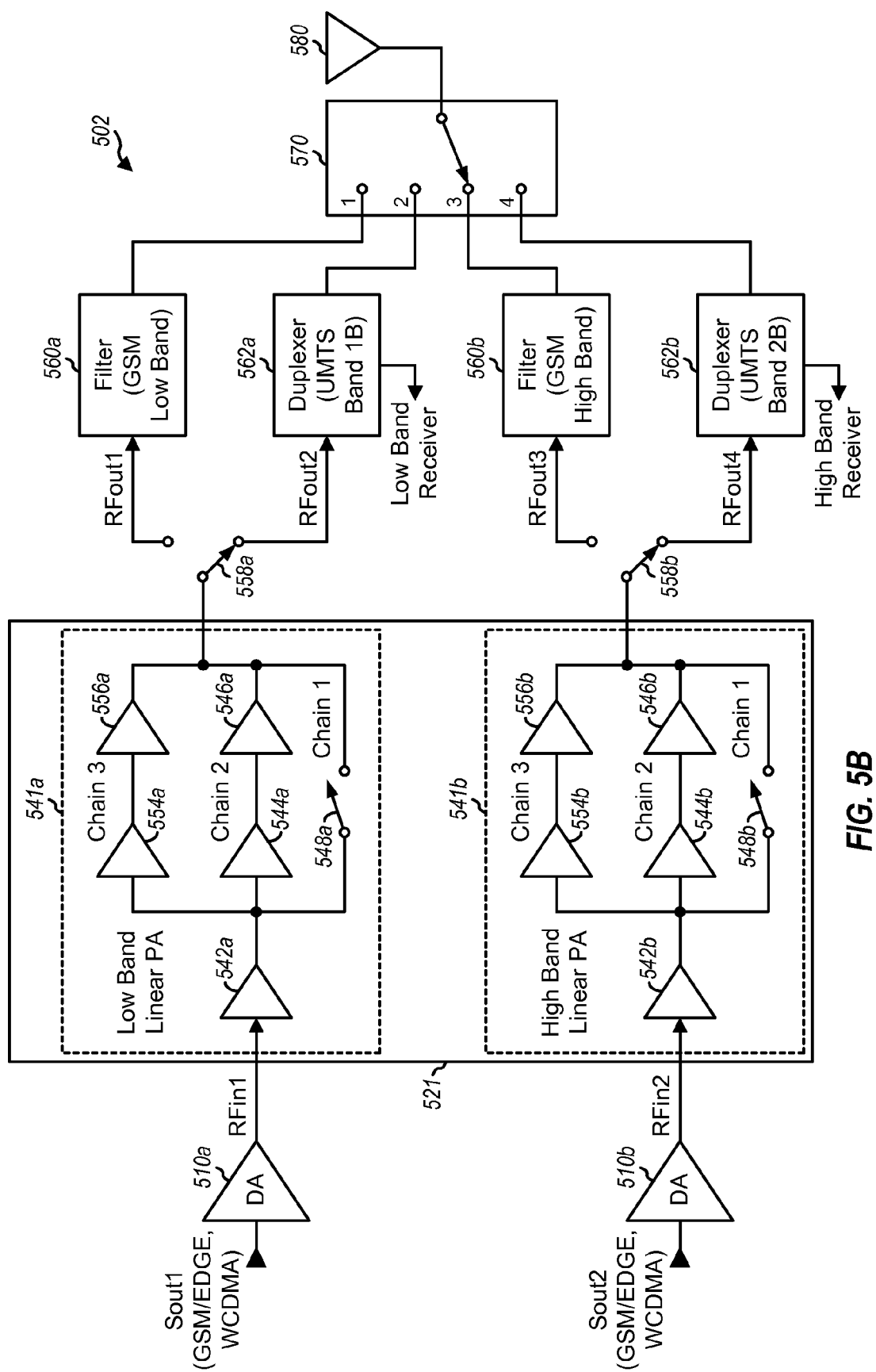

FIG. 5B shows a block diagram of an exemplary design of a transmitter 502 for terminal 110. Transmitter 502 includes all of the circuit blocks in transmitter 500 in FIG. 5A, albeit with the following modifications. A power amplifier module 521 includes linear power amplifiers 541a and 541b. Within power amplifier 541a, the outputs of amplifier stages 546a and 556a are coupled together. Output switch 558a has its common port coupled to the outputs of amplifier stages 546a and 556a, its first throw coupled to filter 560a, and its second throw coupled to duplexer 562a. Amplifier stages 546b and 556b within power amplifier 541b and switch 558b are coupled in similar manner as amplifier stages 546a and 556a and switch 558a. Switches 558a and 558b may be implemented external to module 521 (as shown in FIG. 5B) or within module 521.

Figure 6:
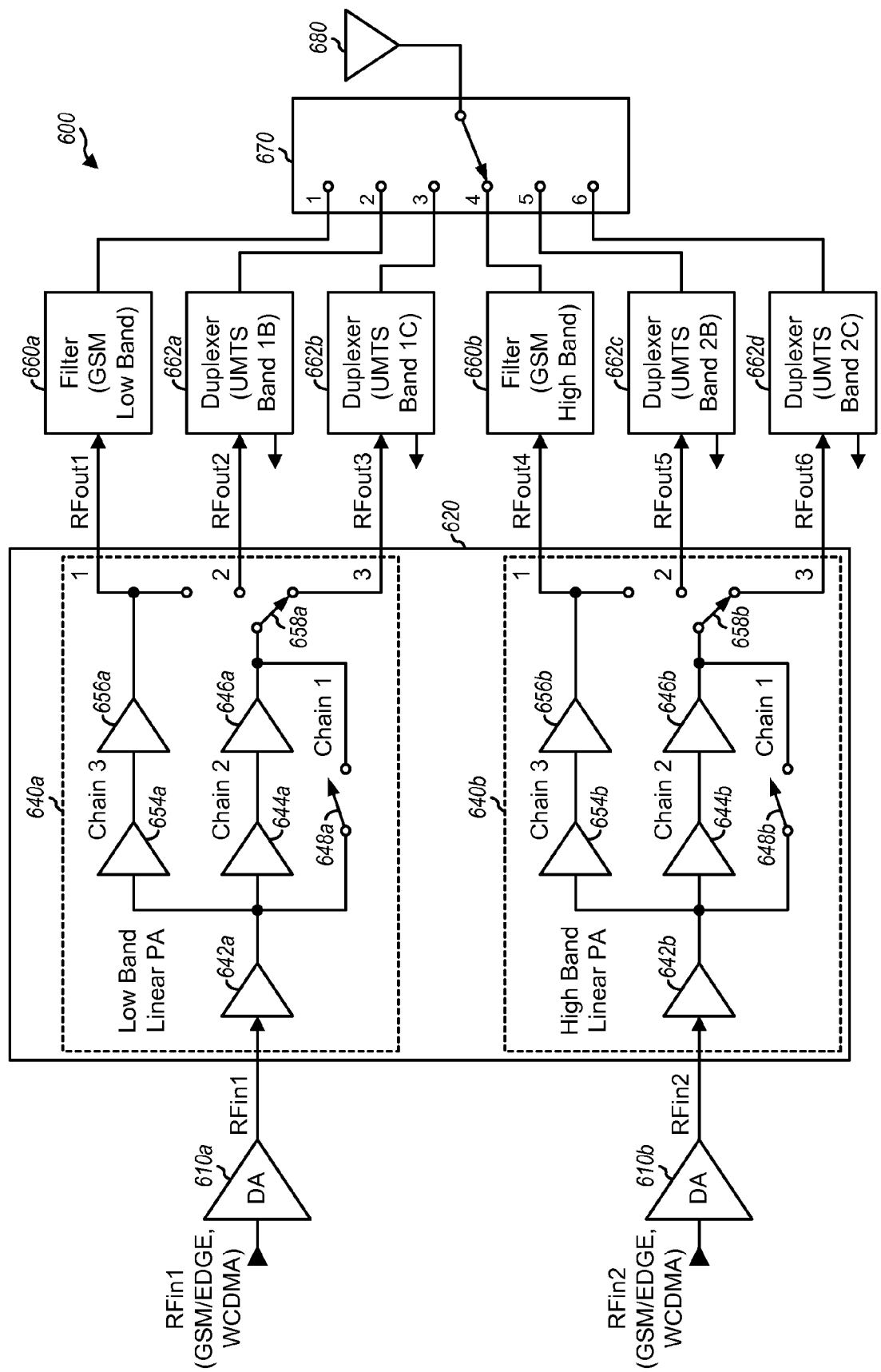

FIG. 6 shows a block diagram of an exemplary design of a transmitter 600 for terminal 110. Transmitter 600 supports four frequency bands for GSM/EDGE and four frequency bands for WCDMA. Transmitter 600 includes driver amplifiers 610a and 610b, a power amplifier module 620, filters 660a and 660b, four duplexers 662a through 662d, and a switch 670. Driver amplifiers 610a and 610b receive and amplify the Sout1 and Sout2 signals and provide the RFin1 and RFin2 signals, as described above for FIG. 5A.

Power amplifier module 620 includes a low band linear power amplifier 640a and a high band linear power amplifier 640b that receive and amplify the RFin1 and RFin2 signals, respectively. Power amplifier 640a includes three parallel chains 1, 2 and 3 comprising amplifier stages 642a, 644a, 646a, 654a and 656a and a switch 648a, which are coupled as described above for FIG. 4A. An output switch 658a has its common port coupled to the output of amplifier stage 646a and its first, second and third throws coupled to first, second and third outputs, respectively, of power amplifier 640a. The output of amplifier stage 656a is coupled to the first output of power amplifier 640a. Power amplifier 640b includes three parallel chains 1, 2 and 3 comprising amplifier stages 642b, 644b, 646b, 654b and 656b and a switch 648b and further includes an output switch 658b, which are coupled in the same manner as power amplifier 640a. Switches 658a and 658b may be implemented within module 620 (as shown in FIG. 6) or external to module 620.

Filters 660a and 660b have their inputs coupled to the first output of power amplifiers 640a and 640b, respectively, and their outputs coupled to the first and fourth ports of switch 670. Duplexers 662a and 662b have their transmitter ports coupled to the second and third outputs of power amplifier 640a, and their common ports coupled to the second and third ports of switch 670. Duplexers 662c and 662d have their transmitter ports coupled to the second and third outputs of power amplifier 640b, and their common ports coupled to the fifth and sixth ports of switch 670. Switch 670 has its common port coupled to an antenna 680. Switch 670 may also include more ports, which may be coupled to GSM/EDGE receivers for low band and high band (not shown in FIG. 6).

Duplexers 662a and 662b may be for two frequency bands (e.g., cellular band and 900 MHz band) in low band. Duplexers 662c and 662d may be for two frequency bands (e.g., PCS band and IMT-2000 band) in high band.

For low band GSM/EDGE, switch 658a couples amplifier stage 646a to the first output of power amplifier 640a, and switch 670 couples its first port to antenna 680.

For the first low frequency band for WCDMA, switch 658a couples amplifier stage 646a to the second output of power amplifier 640a, and switch 670 couples its second port to antenna 680. For the second low frequency band for WCDMA, switch 658a couples amplifier stage 646a to the third output of power amplifier 640a, and switch 670 couples its third port to antenna 680. For high band GSM/EDGE, switch 658b couples amplifier stage 646b to the first output of power amplifier 640b, and switch 670 couples its forth port to antenna 680. For the first high frequency band for WCDMA, switch 658b couples amplifier stage 646b to the second output of power amplifier 640b, and switch 670 couples its fifth port to antenna 680. For the second high frequency band for WCDMA, switch 658b couples amplifier stage 646b to the third output of power amplifier 640b, and switch 670 couples its sixth port to antenna 680.

Figure 7:
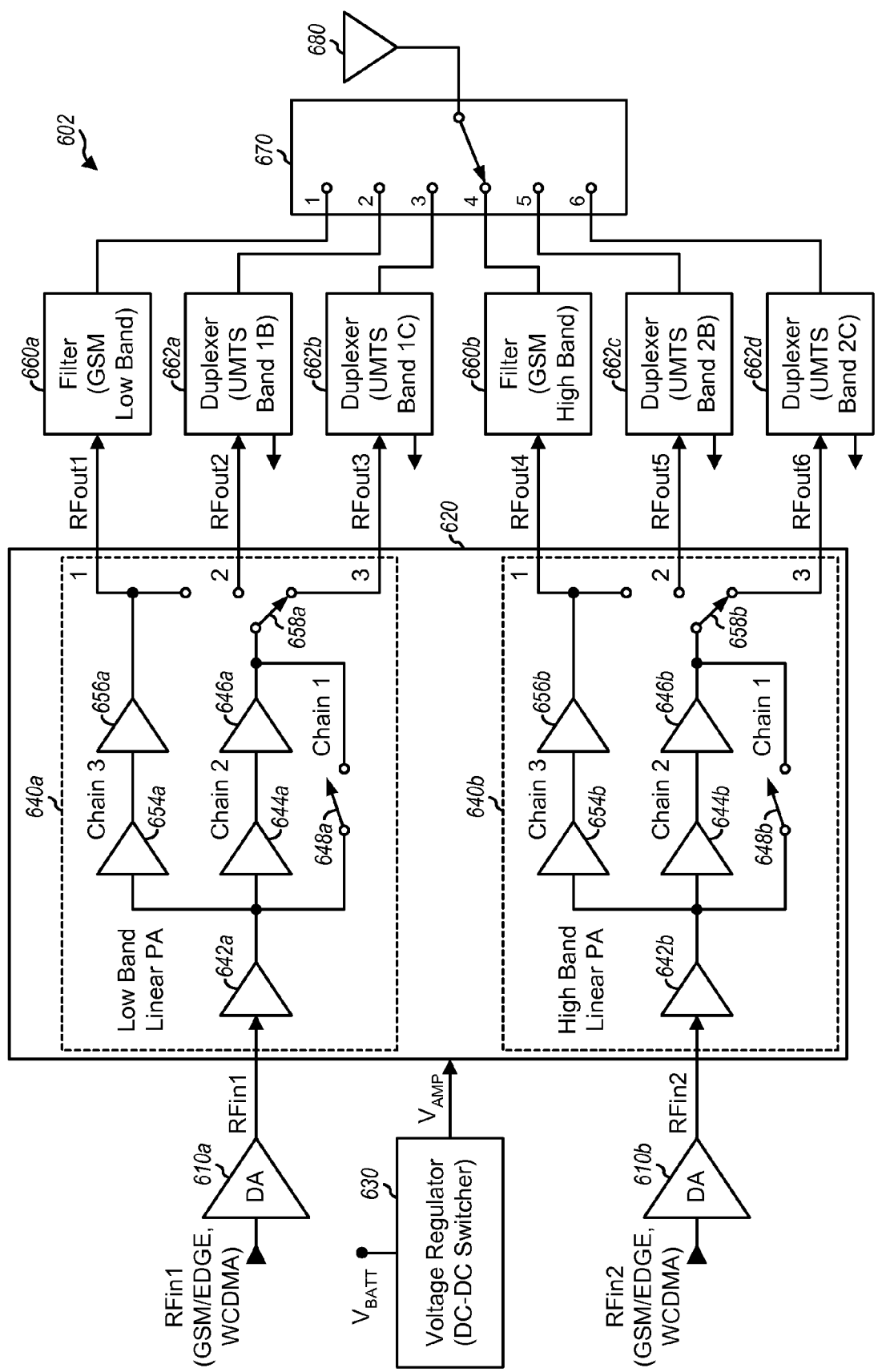

FIG. 7 shows a block diagram of an exemplary design of a transmitter 602 for terminal 110. Transmitter 602 supports four frequency bands for GSM/EDGE and four frequency bands for WCDMA. Transmitter 602 includes all of the circuit blocks in transmitter 600 in FIG. 6. Transmitter 602 further includes a voltage regulator 630, which may be a direct current (DC)-DC switcher such as a boost or buck DC-DC switcher. Voltage regulator 630 receives a power supply voltage (e.g., the battery voltage $V_{BATT}$) and generates a supply voltage $V_{AMP}$ for power amplifiers 640a and 640b. The $V_{AMP}$ voltage may be set based on (e.g., proportional to) the output power level in order to reduce power consumption. Voltage regulator 630 may also be used to support low voltage battery.

Voltage regulator 630 may also be used to support large signal polar modulation. In this case, an envelope signal may be applied to voltage regulator 630, which may generate $V_{AMP}$ containing the envelope information. $V_{AMP}$ may then be applied to at least one output stage of power amplifier 640a and 640b. The RF output signals from power amplifiers 640a and 640b may then have a variable amplitude determined based on the envelope signal. Higher efficiency may be obtained by operating voltage regulator 630 and power amplifiers 640 for large signal polar modulation.

FIGS. 4A through 7 show several exemplary designs of using linear power amplifiers for GSM/EDGE and sharing of linear power amplifiers for GSM, EDGE and WCDMA. In general, a transmitter may include any number of linear power amplifiers, which may be used to support any number of radio technologies as well as any number of frequency bands for each supported radio technology.

Figure 8:
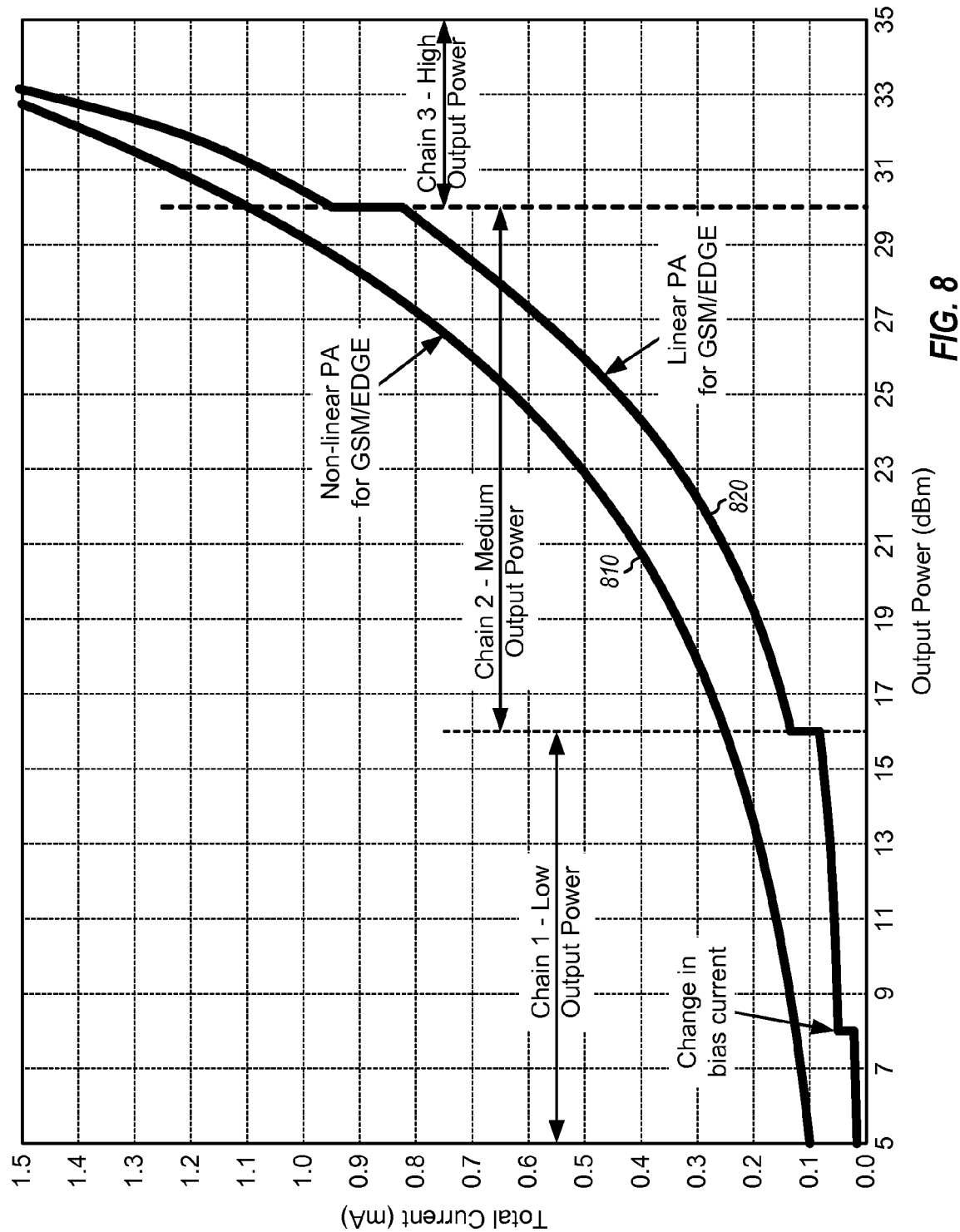
FIG. 8 shows plots of total current versus output power for different PAs.

FIG. 8 shows plots of total current versus output power for different power amplifiers used for GSM/EDGE. A plot 810 shows total current versus output power for non-linear power amplifier 340a or 340b in FIG. 3. A plot 820 shows total current versus output power for a linear power amplifier, which may be power amplifier 440a or 440b in FIG. 4A, power amplifier 441a or 441b in FIG. 4B, power amplifier 540a or 540b in FIG. 5A, power amplifier 541a or 541b in FIG. 5B, or power amplifier 640a or 640b in FIG. 6. In this example, chain 1 is selected for output power up to 16 dBm, chain 2 is selected for output power between 16 dBm and 30 dBm, and chain 3 is selected for output power higher than 30 dBm. The switch points for chains 1, 2 and 3 may also be at other output power levels. In this example, the bias current of chain 1 is changed at 8 dBm, lower bias current is used below 8 dBm, and higher bias current is used above 8 dBm. In general, each chain may have any number of bias current settings, and each bias current setting may be used for any range of output power levels. Plots 810 and 820 indicate that the linear power amplifier for GSM/EDGE may consume less total current than the non-linear power amplifier.

In one exemplary design, the same set of switch points may be used for GSM/EDGE and WCDMA for power amplifiers 540a and 540b in FIG. 5A, power amplifiers 541a and 541b in FIG. 5B, and power amplifiers 640a and 640b in FIGS. 6 and 7. This design may simplify the design and operation of the transmitter. In another exemplary design, one set of switch points may be used for GSM/EDGE, and another set of switch points may be used for WCDMA. The switch points for each radio technology may be selected to meet spectral mask requirements and reduce power consumption.

The power amplifiers described herein may be used with various transmitters. The use of the power amplifiers in some exemplary transmitters are described below.

Figure 9:
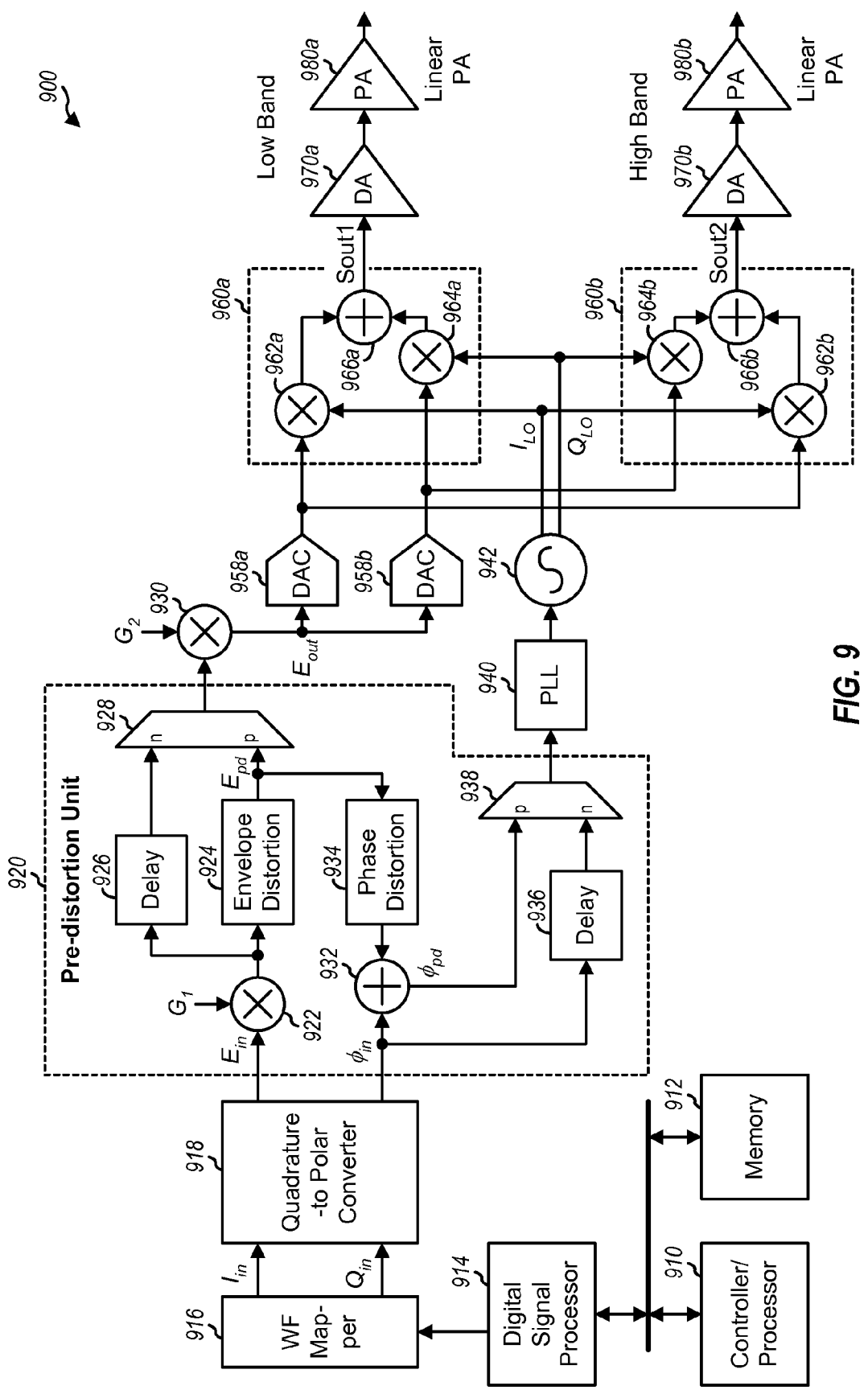
FIG. 9 shows a block diagram of a transmitter supporting polar modulation.

FIG. 9 shows a block diagram of an exemplary design of a transmitter 900 that supports polar modulation. A digital signal processor (DSP) 914 processes (e.g., encodes and interleaves) data to be transmitted and provides coded data. A waveform (WF) mapper 916 maps the coded data to complex-valued symbols based on GMSK, 8-PSK, QPSK, QAM, etc. Waveform mapper 916 may perform other processing such as, e.g., spreading, scrambling, OFDM modulation, SC-FDM modulation, etc. Waveform mapper 916 provides the real part of each complex-valued symbol on an I data signal, $I_{in}$, and provides the imaginary part of each complex-valued symbol on a Q data signal, $Q_{in}$. A quadrature-to-polar converter 918 receives the I and Q data signals, converts the complex-valued symbols in these data signals from Cartesian to polar coordinates, and provides an envelope signal, $E_{in}$, and a phase signal, $\phi_{in}$. Converter 918 may implement equations (3) and (4) on each complex-valued symbol to obtain the magnitude and phase of that symbol.

A pre-distortion unit 920 pre-distorts the envelope and phase signals when enabled and passes the envelope and phase signals otherwise. In the envelope path within unit 920, a multiplier 922 multiplies the envelope signal with a gain $G_1$ and provides a scaled envelope signal. An envelope distortion unit 924 distorts the scaled envelope signal to compensate for non-linearity of a power amplifier and provides a pre-distorted envelope signal, $E_{pd}$, to a first ('p') input of a multiplexer 928. In the description herein, the inputs of multiplexers are labeled with 'p' for pre-distortion and 'n' for no pre-distortion. A delay unit 926 delays the scaled envelope signal from multiplier 922 to match the delay of unit 924 and provides a delayed envelope signal to a second ('n') input of multiplexer 928. Multiplexer 928 provides the pre-distorted envelope signal from unit 924 when pre-distortion is enabled and provides the delayed envelope signal from unit 926 when pre-distortion is not enabled.

In the phase path within unit 920, a phase distortion unit 934 receives the pre-distorted envelope signal from unit 924 and provides a phase correction signal to compensate for phase error due to the non-linearity of the power amplifier. A summer 932 sums the phase signal from converter 918 with the phase correction signal and provides a pre-distorted phase signal, $\phi_{pd}$, to a first ('p') input of a multiplexer 938. A delay unit 936 delays the phase signal from converter 918 and provides the delayed phase signal to a second ('n') input of multiplexer 938. Multiplexer 938 provides the pre-distorted phase signal from unit 934 when pre-distortion is enabled and provides the delayed phase signal from unit 936 when pre-distortion is not enabled.

A multiplier 930 multiplies the envelope signal from multiplexer 928 with a gain $G_2$ and provides an amplified envelope signal, $E_{out}$. Multipliers 922 and 930 may be used for power control to obtain a desired output power level. Digital-to-analog converters (DACs) 958a and 958b convert the amplified envelope signal to analog and provide output envelope signals. A phase locked loop (PLL) 940 receives the phase signal from multiplexer 938 and provides a control signal to a voltage controlled oscillator (VCO) 942. VCO 942 generates I and Q LO signals, $I_{LO}$ and $Q_{LO}$, which have their phases varied by the control signal from PLL 940 to achieve phase modulation.

Modulators 960a and 960b perform amplitude modulation for low band and high band, respectively. Within modulator 960a, a mixer 962a modulates the I LO signal with the output envelope signal from DAC 958a, and a mixer 964a modulates the Q LO signal with the output envelope signal from DAC 958b. A summer 966a sums the outputs of mixers 962a and 964a and provides the Sout1 signal, which is both amplitude and phase modulated. Within modulator 960b, mixers 962b and 964b modulate the I and Q LO signals, respectively, with the output envelope signals from DACs 958a and 958b, respectively. A summer 966b sums the outputs of mixers 962b and 964b and provides the Sout2 signal, which is both amplitude and phase modulated.

Driver amplifiers 970a and 970b amplify the Sout1 and Sout2 signals from modulators 960a and 960b, respectively. Linear power amplifiers 980a and 980b further amplify the RFin1 and RFin2 signals from driver amplifiers 970a and 970b, respectively, and provide the RFout1 and RFout2 signals, respectively. Power amplifiers 980a and 980b may be implemented with power amplifiers 440a and 440b in FIG. 4A, power amplifiers 441a and 441b in FIG. 4B, power amplifiers 540a and 540b in FIG. 5A, amplifiers 541a and 541b in FIG. 5B, or power amplifiers 640a and 640b in FIG. 6.

A controller/processor 910 controls the operation of DSP 914 and other circuit blocks within transmitter 900. A memory 912 stores data and program codes for controller/processor 910 and/or other circuit blocks. Memory 912 may be implemented external to controller/processor 910 (as shown in FIG. 9) or internal to the controller/processor.

FIG. 9 shows small signal polar modulation, which comprises amplitude modulation of a phase modulated signal with an envelope signal prior to a power amplifier. In FIG. 9, modulator 960 performs amplitude modulation using two mixers and a summer. Amplitude modulation may also be performed with a single mixer and no summer. Large signal polar modulation may also be supported by (i) providing the output of DAC 958a or 958b to a voltage regulator to generate $V_{AMP}$ containing envelope information and (ii) providing $V_{AMP}$ to at least one output stage of linear power amplifiers 980a and 980b.

Figure 10:
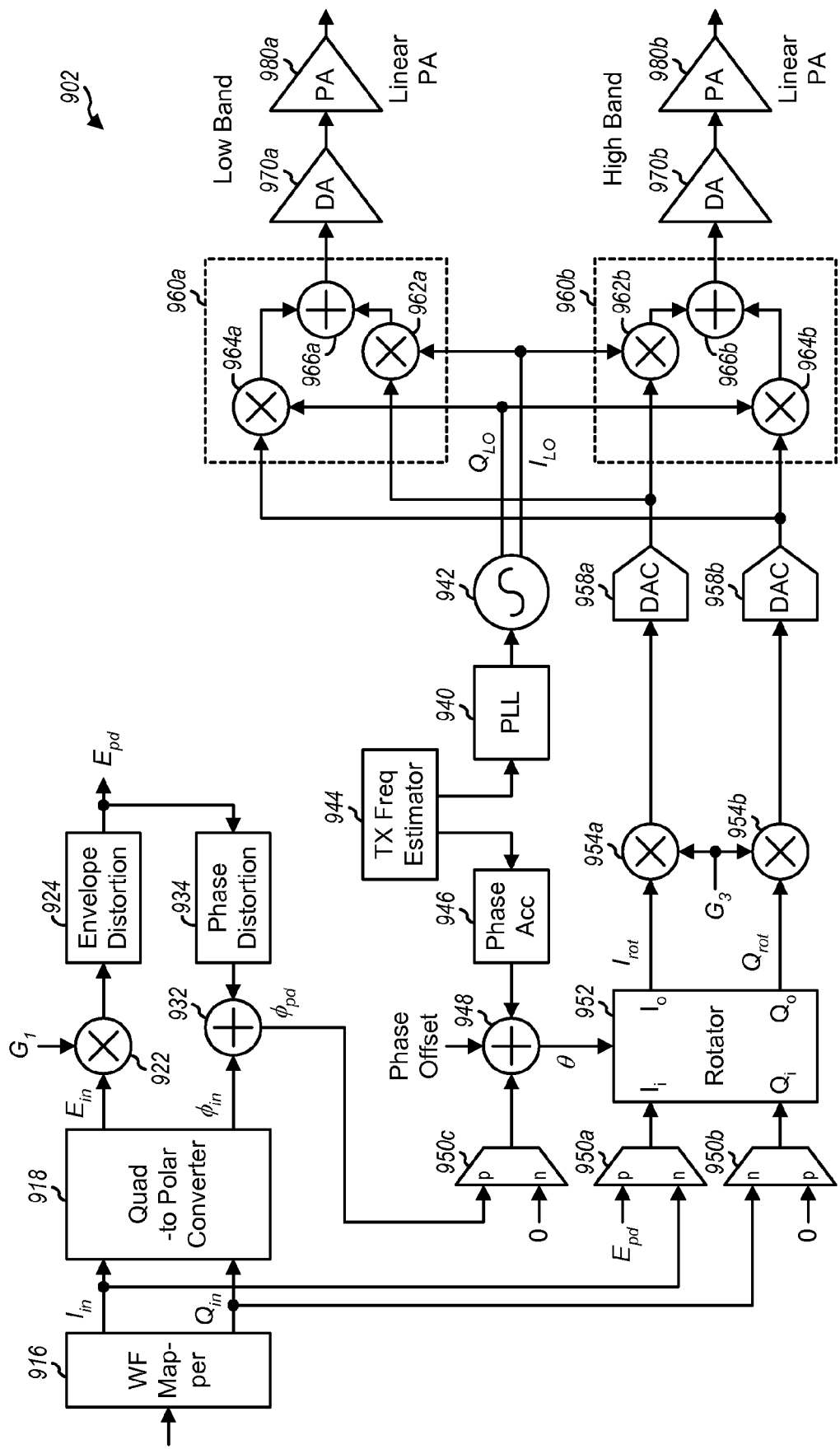
FIG. 10 shows a block diagram of a transmitter supporting quadrature modulation.

FIG. 10 shows a block diagram of an exemplary design of a transmitter 902 that supports quadrature modulation and can selectively apply pre-distortion to compensate for non-linearity of the power amplifiers. Units 910 through 914 are not shown in FIG. 10 for simplicity. Waveform mapper 916 processes data to be transmitted and provides the I and Q data signals, $I_{in}$ and $Q_{in}$. Quadrature-to-polar converter 918, multiplier 922, envelope distortion unit 924, summer 932, and phase distortion unit 934 operate on the I and Q data signals, as described above for FIG. 9, and provide the pre-distorted envelope signal, $E_{pd}$, and the pre-distorted phase signal, $\phi_{pd}$.

Multiplexers 950a and 950b receive the I and Q data signals at a first ('n') input and provide these signals to I and Q inputs of a digital rotator 952 when pre-distortion is not enabled. Multiplexers 950a and 950b also receive the pre-distorted envelope signal, $E_{pd}$, and a zero signal at a second ('p') input and provide these signals to the I and Q inputs of rotator 952 when pre-distortion is enabled. Rotator 952 rotates the signals at its I and Q inputs based on a phase correction signal, θ, and provides I and Q rotated signals, $I_{rot}$ and $Q_{rot}$. When pre-distortion is not enabled, rotator 952 may rotate the I and Q signals to correct for frequency error and phase offset in the LO signals from VCO 942. When pre-distortion is enabled, rotator 952 may rotate the pre-distorted envelope signal to correct for phase distortion due to the power amplifiers as well as frequency error and phase offset in the LO signals.

Multipliers 954a and 954b multiply the I and Q rotated signals from rotator 952 with a gain $G_3$ and provide scaled I and Q signals, respectively. DACs 958a and 958b convert the scaled I and Q signals to analog and provide I and Q modulating signals, respectively. Modulators 960a and 960b perform quadrature modulation for low band and high band, respectively. Each modulator 960 performs quadrature modulation on the I and Q LO signals from VCO 942 with the I and Q modulating signals from DACs 958a and 958b. Driver amplifier 970a and power amplifier 980a amplify the Sout1 signal from modulator 960a and provide the RFout1 signal. Driver amplifier 970b and power amplifier 980b amplify the Sout2 signal from modulator 960b and provide the RFout2 signal.

A transmit (TX) frequency estimator 944 estimates frequency error in the LO signals, provides a coarse frequency error to PLL 940, and provides a fine frequency error to a phase accumulator (Acc) 946. PLL 940 generates the control signal for VCO 942 such that the coarse frequency error is corrected. Accumulator 946 accumulates the fine frequency error and provides a phase error. A multiplexer 950c receives and provides the pre-distorted phase signal, $\phi_{pd}$, when pre-distortion is enabled and provides a zero signal when pre-distortion is not enabled. A summer 948 sums the phase error from accumulator 946, the output of multiplexer 950c, and a phase offset and provides the phase correction signal, θ, to rotator 952.

Figure 11:
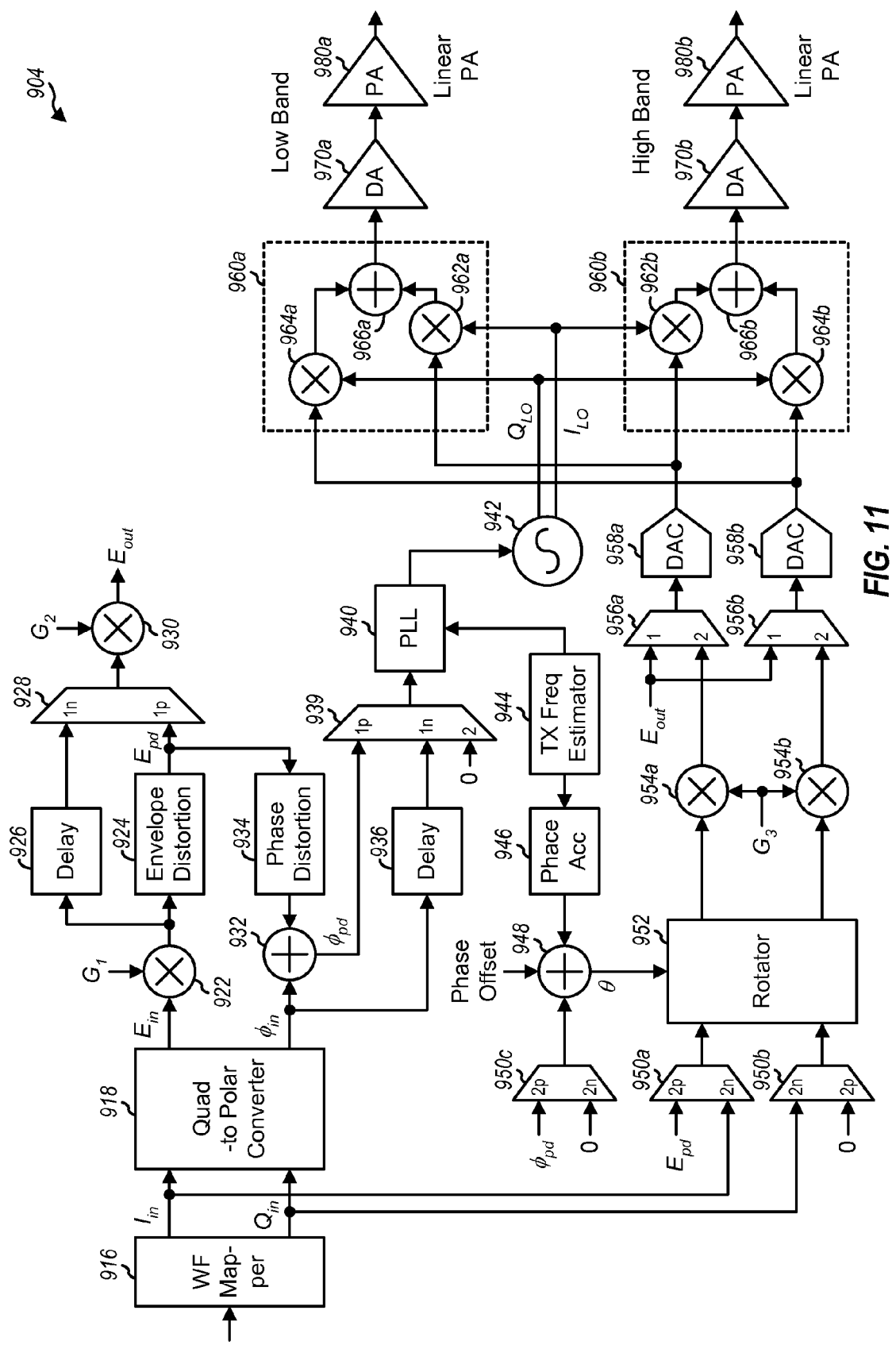
FIG. 11 shows a block diagram of a transmitter supporting both polar modulation and quadrature modulation with and without pre-distortion.

FIG. 11 shows a block diagram of an exemplary design of a transmitter 904 that efficiently supports both polar modulation (mode 1) and quadrature modulation (mode 2) and also supports pre-distortion or no pre-distortion for each mode using shared circuit blocks. In FIG. 11, the multiplexer inputs are labeled with 'p' for pre-distortion, 'n' for no pre-distortion, '1' for mode 1, and/or '2' for mode 2.

Transmitter 904 includes all of the circuit blocks in transmitter 902 in FIG. 10, with several modifications. A multiplexer 939 receives the pre-distorted phase signal, $\phi_{pd}$, from summer 932 at a first ('1p') input, a delayed phase signal from unit 936 at a second ('1n') input, and a zero signal at a third ('2') input. Multiplexer 939 provides the pre-distorted phase signal when polar modulation with pre-distortion is selected, provides the delayed phase signal when polar modulation without pre-distortion is selected, and provides the zero signal when quadrature modulation is selected. PLL 940 operates on the output signal from multiplexer 939, and provides the control signal for VCO 942. Multiplexers 956a and 956b receive the digital envelope signal, $E_{out}$, from multiplier 930 at their first ('1') input and provide this signal to DACs 958a and 958b, respectively, when polar modulation is selected. Multiplexers 956a and 956b also receive the scaled I and Q signals from multipliers 954a and 954b, respectively, at their second ('2') input and provide these signals to DACs 958a and 958b, respectively, when quadrature modulation is selected. The output of DAC 958 may be applied to power amplifier 980 via a voltage regulator for large polar modulation, as described above.

When polar modulation is selected, DACs 958a and 958b provide the output envelope signal, and VCO 942 provides the I and Q LO signals with phase modulation. Modulators 960a and 960b perform amplitude modulation on the I and Q LO signals from VCO 942 with the output envelope signal. When quadrature modulation is selected, DACs 958a and 958b provide the I and Q modulating signals, and VCO 942 provides the I and Q LO signals without phase modulation. Modulators 960a and 960b perform quadrature modulation on the I and Q LO signals with the I and Q modulating signals. Driver amplifiers 970a and 970b and power amplifiers 980a and 980b amplify the Sout1 and Sout2 signals from modulators 960a and 960b and provide the RFout1 and RFout2 signals.

In the exemplary designs shown in FIGS. 9, 10 and 11, pre-distortion or no pre-distortion may be selected based on output power level of the RF output signal and/or other factors. Output power level may be related to input power level, amplifier gain, etc. In one exemplary design, pre-distortion may be performed if the output power level exceeds a threshold and may be skipped if the output power level is below the threshold. The threshold may be selected such that spectral mask and/or other requirements can be satisfied.

FIGS. 9, 10 and 11 show several exemplary designs of transmitters that may be used with the multi-mode power amplifiers described herein. These multi-mode power amplifiers may also be used with other transmitter designs. In general, a transmitter may be implemented with fewer, additional and/or different circuit blocks than those shown in FIGS. 9, 10 and 11. The circuit blocks may also be arranged differently than shown in FIGS. 9, 10 and 11. FIGS. 9, 10 and 11 also show transmitters that implement a direct-conversion architecture, which performs modulation directly at RF to generate a modulated signal at a desired RF frequency. A transmitter may also implement a super-heterodyne transmitter, which performs modulation at an intermediate frequency (IF) and then frequency upconverts the modulated signal to RF.

Figure 12:
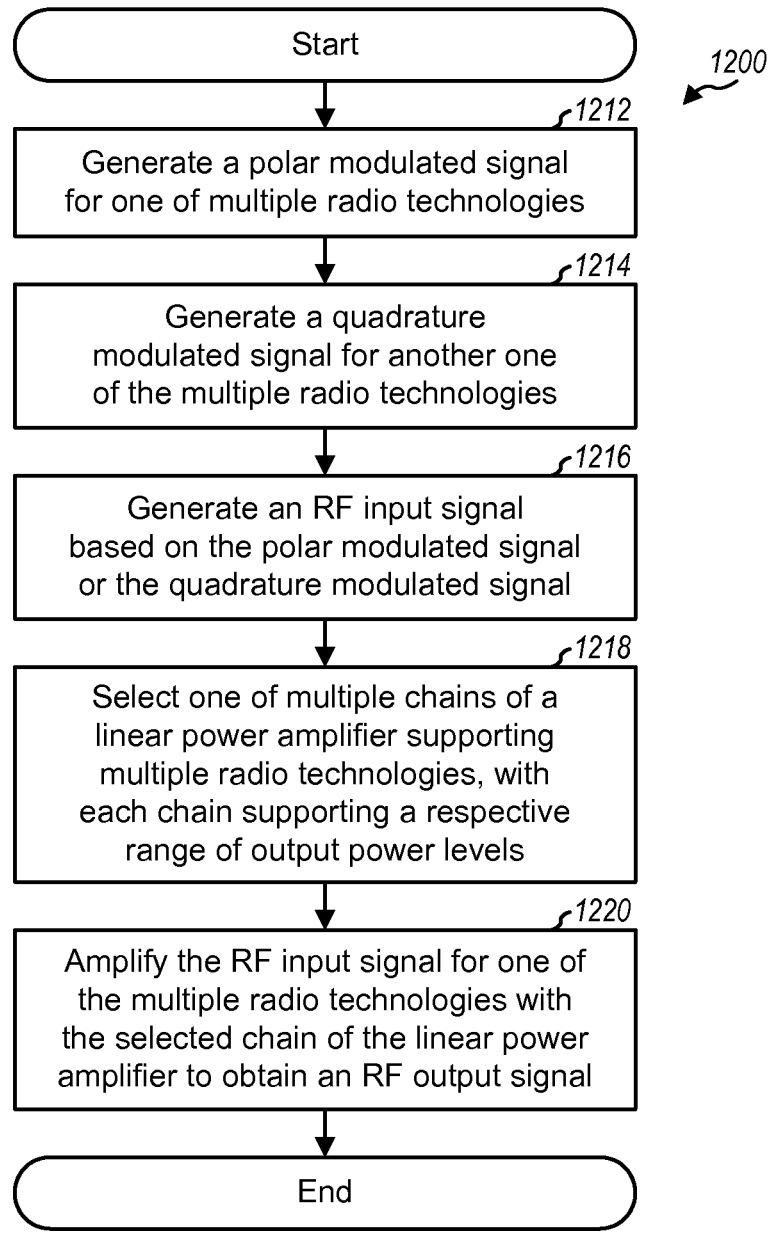
FIG. 12 shows a process for generating an RF output signal.

FIG. 12 shows an exemplary design of a process 1200 for generating an RF output signal. A phase modulated signal may be generated for one of multiple radio technologies, e.g., as shown in FIG. 9 (block 1212). A quadrature modulated signal may be generated for another one of the multiple radio technologies, e.g., as shown in FIG. 10 (block 1214). Either the phase modulated signal or the quadrature modulated signal may be generated at any given moment depending on the radio technology used for communication. An RF input signal may be generated based on the phase modulated signal or the quadrature modulated signal, e.g., by passing the phase or quadrature modulated signal through a driver amplifier (block 1216). The RF input signal may be pre-distorted to compensate for non-linearity of a linear power amplifier, as shown in FIG. 9 or 10.

One of multiple chains of a linear power amplifier supporting the multiple radio technologies may be selected, with each chain supporting a respective range of output power levels, e.g., as shown in FIG. 8 (block 1218). The bias current of at least one amplifier stage in the selected chain may be adjusted based on output power level. The RF input signal for one of the multiple radio technologies may be amplified with the selected chain of the linear power amplifier to obtain an RF output signal (block 1220).

The transmitters and power amplifiers described herein may be implemented on an integrated circuit (IC), an analog IC, an RF IC (RFIC), a mixed-signal IC, an application specific integrated circuit (ASIC), a printed circuit board (PCB), an electronics device, etc. The transmitters and power amplifiers may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the transmitters and power amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) a power amplifier (PA) module, (v) an ASIC such as a mobile station modem (MSM), (vi) a module that may be embedded within other devices, (vii) a receiver, cellular phone, wireless device, handset, or mobile unit, (viii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first linear power amplifier supporting multiple radio technologies and operative to amplify a first radio frequency (RF) input signal and provide a first RF output signal, the first linear power amplifier comprising multiple chains coupled in parallel and including at least one amplifier stage having an output common and continuously coupled to each chain of the multiple chains, each chain being selectable between the output of the at least one amplifier stage and an output of an amplifier stage within the multiple chains, each chain further being independent of at least one other chain to amplify the first RF input signal and provide the first RF output signal for a respective range of output power levels.

2. The apparatus of claim 1, further comprising:
a second linear power amplifier supporting the multiple radio technologies and operative to amplify a second RF input signal and provide a second RF output signal, the first linear power amplifier supporting one of low and high frequency bands, and the second linear power amplifier supporting the other one of the low and high frequency bands.

3. The apparatus of claim 2, wherein the low frequency band is less than one gigahertz (GHz) and the high frequency band is greater than one GHz.

4. The apparatus of claim 1, wherein the multiple chains comprise
a first chain selectable to amplify the first RF input signal and provide the first RF output signal for a first range of output power levels, and
a second chain selectable to amplify the first RF input signal and provide the first RF output signal for a second range of output power levels higher than the first range.

5. The apparatus of claim 4, wherein the multiple chains further comprise
a third chain selectable to amplify the first RF input signal and provide the first RF output signal for a third range of output power levels equal to or higher than the second range.

6. The apparatus of claim 5, wherein the second and third chains are selectable concurrently to provide higher output power.

7. The apparatus of claim 1, wherein the multiple chains comprise
a first chain comprising the first amplifier stage, and
a second chain comprising the first amplifier stage and at least one additional amplifier stage.

8. The apparatus of claim 1, wherein the multiple chains comprise
a first chain comprising the first amplifier stage,
a second chain comprising the first amplifier stage and at least one medium power amplifier stage, and
a third chain comprising the first amplifier stage and at least one high power amplifier stage.

9. The apparatus of claim 1, wherein the multiple chains are biased with different amounts of current.

10. The apparatus of claim 1, wherein at least one chain among the multiple chains is biased with different amounts of current for different ranges of output power levels.

11. The apparatus of claim 1, wherein the multiple chains are implemented with transistors of different sizes.

12. The apparatus of claim 1, wherein each of the multiple chains are selectable for at least one of the multiple radio technologies, and wherein a subset of the multiple chains is selectable for at least one other one of the multiple radio technologies.

13. The apparatus of claim 1, further comprising:
a switch coupled to at least two of the multiple chains and operative to provide the first RF output signal to a first output for one of the multiple radio technologies and to provide the first RF output signal to a second output for another one of the multiple radio technologies.

14. The apparatus of claim 1, further comprising:
a modulator operative to perform quadrature modulation for at least one of the multiple radio technologies, to perform polar modulation for at least other one of the multiple radio technologies, and to provide a modulated signal; and
a driver amplifier operative to amplify the modulated signal and provide the first RF input signal.

15. The apparatus of claim 1, wherein the first RF input signal comprises a phase modulated signal for one of the multiple radio technologies and comprises a quadrature modulated signal for another one of the multiple radio technologies.

16. The apparatus of claim 1, wherein the first RF input signal is pre-distorted to compensate for non-linearity of the first linear power amplifier.

17. The apparatus of claim 1, further comprising:
a direct current (DC)-DC switcher operative to receive a power supply voltage and generate a supply voltage for the first linear power amplifier.

18. The apparatus of claim 1, further comprising:
a voltage regulator operative to receive an envelope signal and a power supply voltage and generate a supply voltage for the first linear power amplifier, the supply voltage comprising envelope information from the envelope signal.

19. The apparatus of claim 18, the envelope signal being pre-distorted to compensate for non-linearity of the first linear power amplifier.

20. The apparatus of claim 1, wherein the first linear power amplifier provides multiple RF outputs for different radio technologies.

21. The apparatus of claim 1, wherein the first linear power amplifier provides multiple RF outputs for different frequency bands.

22. The apparatus of claim 1, wherein the first linear power amplifier provides multiple RF outputs for different output power ranges.

23. The apparatus of claim 1, wherein the multiple radio technologies comprise a first radio technology having a constant envelope modulated signal and a second radio technology having a variable envelope modulated signal.

24. An apparatus comprising:
a linear power amplifier operative to amplify a radio frequency (RF) input signal having a constant envelope and provide an RF output signal, the linear power amplifier comprising multiple chains coupled in parallel and including at least one amplifier stage having an output common and continuously coupled to each chain of the multiple chains, each chain being selectable between the output of the at least one amplifier stage and an output of an amplifier stage within the multiple chains, each chain further being independent of at least one other chain to amplify the RF input signal and provide the RF output signal for a respective range of output power levels.

25. The apparatus of claim 24, further comprising:
a modulator operative to perform polar modulation and provide a phase modulated signal; and
a driver amplifier operative to amplify the phase modulated signal and provide the RF input signal that saturates an output of the linear power amplifier.

26. The apparatus of claim 25, further comprising:
a voltage regulator operative to receive an envelope signal and a power supply voltage and generate a supply voltage for the linear power amplifier, the supply voltage comprising envelope information from the envelope signal.

27. The apparatus of claim 24, further comprising:
a direct current (DC)-DC switcher operative to receive an envelope signal or a power supply voltage and generate a supply voltage for the linear power amplifier.

28. The apparatus of claim 24, wherein the linear power amplifier is operative to amplify the RF input signal with a fixed gain, wherein the RF input signal has a variable signal level, and wherein signal level of the RF output signal tracks the variable signal level of the RF input signal.

29. An apparatus comprising:
a power amplifier operative to amplify a radio frequency (RF) input signal and provide an RF output signal, the RF input signal being pre-distorted to compensate for non-linearity of the power amplifier, the power amplifier comprising multiple chains coupled in parallel and including at least one amplifier stage having an output common and continuously coupled to each chain of the multiple chains, each chain being selectable between the output of the at least one amplifier stage and an output of an amplifier stage within the multiple chains, each chain further being independent of at least one other chain to amplify the RF input signal and provide the RF output signal for a respective range of output power levels.

30. The apparatus of claim 29, further comprising:
a pre-distortion unit operative to pre-distort or not pre-distort the RF input signal based on output power level of the RF output signal.

31. The apparatus of claim 30, wherein the pre-distortion unit pre-distorts the RF input signal if the output power level exceeds a threshold and does not pre-distort the RF input signal if the output power level is below the threshold.

32. The apparatus of claim 29, further comprising:
a modulator operative to perform polar modulation and provide a phase modulated signal; and
a driver amplifier operative to amplify the phase modulated signal and provide the RF input signal.

33. The apparatus of claim 29, further comprising:
a direct current (DC)-DC switcher operative to receive an envelope signal or a power supply voltage and generate a supply voltage for the power amplifier.

34. A wireless device comprising:
a first modulator operative to receive and modulate a first local oscillator (LO) signal with a first modulating signal and provide a first modulated signal;
a first driver amplifier coupled to the first modulator and operative to amplify the first modulated signal and provide a first radio frequency (RF) input signal;
a first linear power amplifier coupled to the first modulator and supporting multiple radio technologies, the first linear power amplifier operative to amplify the first RF input signal and provide a first RF output signal, the first linear power amplifier comprising multiple chains coupled in parallel and including at least one amplifier stage having an output common and continuously coupled to each chain of the multiple chains, each chain being selectable between the output of the at least one amplifier stage and an output of an amplifier stage within the multiple chains, each chain further being independent of at least one other chain to amplify the first RF input signal and provide the first RF output signal for a respective range of output power levels; and
an antenna coupled to the first linear power amplifier.

35. The wireless device of claim 34, further comprising:
a second modulator operative to receive and modulate a second LO signal with a second modulating signal and provide a second modulated signal;
a second driver amplifier coupled to the second modulator and operative to amplify the second modulated signal and provide a second RF input signal; and
a second linear power amplifier supporting the multiple radio technologies and operative to amplify the second RF input signal and provide a second RF output signal, the first linear power amplifier supporting one of low and high frequency bands, and the second linear power amplifier supporting the other one of the low and high frequency bands.

36. The wireless device of claim 34, further comprising:
a pre-distortion unit operative to pre-distort or not pre-distort the first RF input signal based on output power level of the first RF output signal.

37. A method of performing amplification comprising:
selecting one chain of multiple chains independent of at least one other chain of the multiple chains of a linear power amplifier supporting multiple radio technologies and including at least one amplifier stage having an output common and continuously coupled to each chain of the multiple chains, each chain being selectable between the output of the at least one amplifier stage and an output of an amplifier stage within the multiple chains, each chain further being operable to provide a respective range of output power levels; and
amplifying a radio frequency (RF) input signal for one of the multiple radio technologies with the selected chain of the linear power amplifier to obtain an RF output signal.

38. The method of claim 37, further comprising:
adjusting bias current of one or more amplifier stages in the selected chain based on output power level.

39. The method of claim 37, further comprising:
generating a phase modulated signal for a first radio technology among the multiple radio technologies;
generating a quadrature modulated signal for a second radio technology among the multiple radio technologies; and
generating the RF input signal based on the phase modulated signal or the quadrature modulated signal.

40. The method of claim 37, further comprising:
pre-distorting the RF input signal to compensate for non-linearity of the linear power amplifier.

41. An apparatus comprising:
means for selecting one chain of multiple chains independent of at least one other chain of the multiple chains of a linear power amplifier supporting multiple radio technologies and including at least one amplifier stage having an output common and continuously coupled to each chain of the multiple chains, each chain being selectable between the output of the at least one amplifier stage and an output of an amplifier stage within the multiple chains, each chain further being operable to provide a respective range of output power levels; and
means for amplifying a radio frequency (RF) input signal for one of the multiple radio technologies with the selected chain of the linear power amplifier to obtain an RF output signal.

42. The apparatus of claim 41, further comprising:
means for adjusting bias current of at least one amplifier stage in the selected chain based on output power level.

43. The apparatus of claim 41, further comprising:
means for generating a phase modulated signal for a first radio technology among the multiple radio technologies;
means for generating a quadrature modulated signal for a second radio technology among the multiple radio technologies; and
means for generating the RF input signal based on the phase modulated signal or the quadrature modulated signal.

44. The apparatus of claim 41, further comprising:
means for pre-distorting the RF input signal to compensate for non-linearity of the linear power amplifier.

* * * * *